(12) United States Patent
Im et al.

(10) Patent No.: US 8,614,471 B2
(45) Date of Patent: Dec. 24, 2013

(54) COLLECTIONS OF LATERALLY CRYSTALLIZED SEMICONDUCTOR ISLANDS FOR USE IN THIN FILM TRANSISTORS

(75) Inventors: James S. Im, New York, NY (US); Ui-Jin Chung, Fort Lee, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 412 days.

(21) Appl. No.: 12/679,064

(22) PCT Filed: Sep. 22, 2008

(86) PCT No.: PCT/US2008/077199
§ 371 (c)(1),
(2), (4) Date: Jan. 27, 2011

(87) PCT Pub. No.: WO2009/039482
PCT Pub. Date: Mar. 26, 2009

(65) Prior Publication Data
US 2011/0108843 A1     May 12, 2011

Related U.S. Application Data

(60) Provisional application No. 60/994,692, filed on Sep. 21, 2007.

(51) Int. Cl.
*H01L 27/108* (2006.01)
*H01L 21/336* (2006.01)
*H01L 29/76* (2006.01)

(52) U.S. Cl.
USPC ............ 257/296; 257/13; 257/213; 257/306; 257/309; 257/530; 257/531; 257/E29.003; 257/E29.297; 438/197; 438/22; 438/253; 438/254; 438/268

(58) Field of Classification Search
USPC ........... 257/296, 13, 213, 306, 309, 530, 531, 257/29.003, E29.297
See application file for complete search history.

(56) References Cited

U.S. PATENT DOCUMENTS

| 3,632,205 A | 1/1972 | Marcy et al. |
| 4,234,358 A | 11/1980 | Celler et al. |

(Continued)

FOREIGN PATENT DOCUMENTS

| CN | 1495848 A | 5/2004 |
| CN | 101111925 A | 1/2008 |

(Continued)

OTHER PUBLICATIONS

Bergmann, R. et al., Nucleation and Growth of Crystalline Silicon Films on Glass for Solar Cells, Phys. Stat. Sol., 1998, pp. 587-602, vol. 166, Germany.

(Continued)

*Primary Examiner* — Zandra Smith
*Assistant Examiner* — Tsz Chiu
(74) *Attorney, Agent, or Firm* — Wilmer Cutler Pickering Hale and Dorr LLP

(57) ABSTRACT

Collections of laterally crystallized semiconductor islands for use in thin film transistors and systems and methods for making same are described. A display device includes a plurality of thin film transistors (TFTs) on a substrate, such that the TFTs are spaced apart from each other and each include a channel region that has a crystalline microstructure and a direction along which a channel current flows. The channel region of each of the TFTs contains a crystallographic grain that spans the length of that channel region along its channel direction. Each crystallographic grain in the channel region of each of the TFTs is physically disconnected from and crystallographically uncorrelated with each crystallographic grain in the channel region of each adjacent TFT.

17 Claims, 25 Drawing Sheets

(56) References Cited

U.S. PATENT DOCUMENTS

| | | |
|---|---|---|
| 4,309,225 A | 1/1982 | Fan et al. |
| 4,382,658 A | 5/1983 | Shields et al. |
| 4,456,371 A | 6/1984 | Lin |
| 4,639,277 A | 1/1987 | Hawkins |
| 4,691,983 A | 9/1987 | Kobayashi et al. |
| 4,727,047 A | 2/1988 | Bozler et al. |
| 4,758,533 A | 7/1988 | Magee et al. |
| 4,793,694 A | 12/1988 | Liu |
| 4,800,179 A | 1/1989 | Mukai et al. |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,977,104 A | 12/1990 | Sawada et al. |
| 5,032,233 A | 7/1991 | Yu et al. |
| 5,061,655 A | 10/1991 | Ipposhi et al. |
| 5,076,667 A | 12/1991 | Stewart |
| RE33,836 E | 3/1992 | Resor, III et al. |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai et al. |
| 5,247,375 A | 9/1993 | Mochizuki |
| 5,281,840 A | 1/1994 | Sarma |
| 5,285,236 A | 2/1994 | Jain |
| 5,291,240 A | 3/1994 | Jain |
| 5,294,811 A | 3/1994 | Aoyama et al. |
| 5,304,357 A | 4/1994 | Sato et al. |
| 5,338,959 A | 8/1994 | Kim et al. |
| 5,373,803 A | 12/1994 | Noguchi et al. |
| 5,395,481 A | 3/1995 | McCarthy |
| 5,409,867 A | 4/1995 | Asano et al. |
| 5,453,594 A | 9/1995 | Konecny |
| 5,456,763 A | 10/1995 | Kaschmitter et al. |
| 5,496,768 A | 3/1996 | Kudo et al. |
| 5,512,494 A | 4/1996 | Tanabe et al. |
| 5,523,193 A | 6/1996 | Nelson |
| 5,529,951 A | 6/1996 | Noguchi et al. |
| 5,571,430 A | 11/1996 | Kawasaki et al. |
| 5,591,668 A | 1/1997 | Maegawa et al. |
| 5,663,579 A | 9/1997 | Noguchi |
| 5,683,935 A | 11/1997 | Miyamoto |
| 5,710,050 A | 1/1998 | Makita et al. |
| 5,721,606 A | 2/1998 | Jain |
| 5,742,426 A | 4/1998 | York |
| 5,756,364 A | 5/1998 | Tanaka et al. |
| 5,766,989 A | 6/1998 | Maegawa et al. |
| 5,767,003 A | 6/1998 | Noguchi |
| 5,817,548 A | 10/1998 | Noguchi et al. |
| 5,844,588 A | 12/1998 | Anderson |
| 5,858,807 A | 1/1999 | Kawamura |
| 5,861,991 A | 1/1999 | Fork |
| 5,893,990 A | 4/1999 | Tanaka et al. |
| 5,948,291 A | 9/1999 | Neylan et al. |
| 5,960,323 A | 9/1999 | Wakita et al. |
| 5,986,807 A | 11/1999 | Fork |
| 6,002,523 A | 12/1999 | Tanaka |
| 6,014,944 A | 1/2000 | Aklufi et al. |
| 6,020,224 A | 2/2000 | Shimogaichi et al. |
| 6,020,244 A | 2/2000 | Thompson et al. |
| 6,045,980 A | 4/2000 | Edelkind et al. |
| 6,072,631 A | 6/2000 | Guenther et al. |
| 6,081,381 A | 6/2000 | Shalapenok et al. |
| 6,117,752 A | 9/2000 | Suzuki et al. |
| 6,120,976 A | 9/2000 | Treadwell et al. |
| 6,130,009 A | 10/2000 | Smith et al. |
| 6,130,455 A | 10/2000 | Yoshinouchi et al. |
| 6,135,632 A | 10/2000 | Flint |
| 6,136,632 A | 10/2000 | Higashi |
| 6,156,997 A | 12/2000 | Yamazaki et al. |
| 6,162,711 A | 12/2000 | Ma et al. |
| 6,169,014 B1 | 1/2001 | McCulloch et al. |
| 6,172,820 B1 | 1/2001 | Kuwahara et al. |
| 6,176,922 B1 | 1/2001 | Aklufi et al. |
| 6,177,301 B1 | 1/2001 | Jung et al. |
| 6,184,490 B1 | 2/2001 | Schweizer |
| 6,187,088 B1 | 2/2001 | Okumura et al. |
| 6,190,985 B1 | 2/2001 | Buynoski |
| 6,193,796 B1 | 2/2001 | Yang |
| 6,203,952 B1 | 3/2001 | O'Brien et al. |
| 6,235,614 B1 | 5/2001 | Yang et al. |
| 6,242,291 B1 | 6/2001 | Kusumoto et al. |
| 6,274,488 B1 | 8/2001 | Talwar et al. |
| 6,285,001 B1 | 9/2001 | Fleming et al. |
| 6,300,175 B1 | 10/2001 | Moon et al. |
| 6,313,435 B1 | 11/2001 | Shoemaker et al. |
| 6,316,338 B1 | 11/2001 | Jung et al. |
| 6,320,227 B1 | 11/2001 | Lee et al. |
| 6,322,625 B2 | 11/2001 | Im |
| 6,326,186 B1 | 12/2001 | Kirk et al. |
| 6,326,215 B1 | 12/2001 | Keen |
| 6,326,286 B1 | 12/2001 | Park et al. |
| 6,333,232 B1 | 12/2001 | Kunikiyo et al. |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,388,146 B1 | 5/2002 | Onishi et al. |
| 6,388,386 B1 | 5/2002 | Kunii et al. |
| 6,392,810 B1 | 5/2002 | Tanaka et al. |
| 6,393,042 B1 | 5/2002 | Tanaka et al. |
| 6,407,012 B1 | 6/2002 | Miyasaka et al. |
| 6,410,373 B1 | 6/2002 | Chang et al. |
| 6,429,100 B2 | 8/2002 | Yoneda et al. |
| 6,432,758 B1 | 8/2002 | Cheng et al. |
| 6,437,284 B1 | 8/2002 | Okamoto et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,479,837 B1 | 11/2002 | Ogawa et al. |
| 6,482,722 B2 | 11/2002 | Kunii et al. |
| 6,493,042 B1 | 12/2002 | Bozdagi et al. |
| 6,495,067 B1 | 12/2002 | Ono et al. |
| 6,495,405 B2 | 12/2002 | Voutsas et al. |
| 6,501,095 B2 | 12/2002 | Yamaguchi et al. |
| 6,504,175 B1 | 1/2003 | Mei et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka et al. |
| 6,516,009 B1 | 2/2003 | Tanaka et al. |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,531,681 B1 | 3/2003 | Markle et al. |
| 6,535,535 B1 | 3/2003 | Yamazaki et al. |
| 6,555,422 B1 | 4/2003 | Yamazaki et al. |
| 6,555,449 B1 | 4/2003 | Im et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Sposili et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,741,621 B2 | 5/2004 | Asano |
| 6,750,424 B2 | 6/2004 | Tanaka |
| 6,755,909 B2 | 6/2004 | Jung |
| 6,784,455 B2 | 8/2004 | Maekawa et al. |
| 6,830,993 B1 | 12/2004 | Im et al. |
| 6,858,477 B2 | 2/2005 | Deane et al. |
| 6,908,835 B2 | 6/2005 | Sposili et al. |

(56) References Cited

U.S. PATENT DOCUMENTS

| | | |
|---|---|---|
| 6,916,690 B2 | 7/2005 | Chang |
| 6,961,117 B2 | 11/2005 | Im |
| 6,962,860 B2 | 11/2005 | Yamazaki et al. |
| 6,984,573 B2 | 1/2006 | Yamazaki et al. |
| 7,029,996 B2 | 4/2006 | Im et al. |
| 7,078,281 B2 | 7/2006 | Tanaka et al. |
| 7,078,793 B2 | 7/2006 | Ruckerbauer et al. |
| 7,091,411 B2 | 8/2006 | Falk et al. |
| 7,115,503 B2 | 10/2006 | Im |
| 7,119,365 B2 | 10/2006 | Takafuji et al. |
| 7,132,204 B2 | 11/2006 | Jung |
| 7,144,793 B2 | 12/2006 | Gosain et al. |
| 7,160,763 B2 | 1/2007 | Im et al. |
| 7,164,152 B2 | 1/2007 | Im |
| 7,183,229 B2 | 2/2007 | Yamanaka |
| 7,187,016 B2 | 3/2007 | Arima |
| 7,189,624 B2 | 3/2007 | Ito |
| 7,192,479 B2 | 3/2007 | Mitani et al. |
| 7,192,818 B1 | 3/2007 | Lee et al. |
| 7,199,397 B2 | 4/2007 | Huang et al. |
| 7,217,605 B2 | 5/2007 | Kawasaki et al. |
| 7,220,660 B2 | 5/2007 | Im et al. |
| 7,297,982 B2 | 11/2007 | Suzuki et al. |
| 7,311,778 B2 | 12/2007 | Im et al. |
| 7,318,866 B2 | 1/2008 | Im |
| 7,323,368 B2 | 1/2008 | Takayama et al. |
| 7,326,876 B2 | 2/2008 | Jung |
| 7,364,952 B2 | 4/2008 | Im |
| 7,399,359 B2 | 7/2008 | Im et al. |
| 7,622,370 B2 | 11/2009 | Im |
| 7,629,234 B2 | 12/2009 | Bruland |
| 7,645,337 B2 | 1/2010 | Im et al. |
| 7,691,687 B2 | 4/2010 | Im |
| 7,700,462 B2 | 4/2010 | Tanaka et al. |
| 7,709,378 B2 | 5/2010 | Im |
| 7,804,647 B2 | 9/2010 | Mitani et al. |
| 7,964,480 B2 | 6/2011 | Im et al. |
| 2001/0001745 A1 | 5/2001 | Im et al. |
| 2001/0029089 A1 | 10/2001 | Tanaka |
| 2001/0030292 A1 | 10/2001 | Brotherton |
| 2001/0041426 A1 | 11/2001 | Im |
| 2002/0083557 A1 | 7/2002 | Jung |
| 2002/0104750 A1 | 8/2002 | Ito |
| 2002/0119609 A1 | 8/2002 | Hatano et al. |
| 2002/0151115 A1 | 10/2002 | Nakajima et al. |
| 2002/0197778 A1 | 12/2002 | Kasahara et al. |
| 2003/0006221 A1 | 1/2003 | Hong et al. |
| 2003/0013278 A1 | 1/2003 | Jang et al. |
| 2003/0013280 A1 | 1/2003 | Yamanaka |
| 2003/0022471 A1 | 1/2003 | Taketomi et al. |
| 2003/0029212 A1 | 2/2003 | Im |
| 2003/0057418 A1 | 3/2003 | Asano |
| 2003/0060026 A1 | 3/2003 | Yamazaki et al. |
| 2003/0068836 A1 | 4/2003 | Hongo et al. |
| 2003/0088848 A1 | 5/2003 | Crowder |
| 2003/0096489 A1 | 5/2003 | Im et al. |
| 2003/0104682 A1 | 6/2003 | Hara |
| 2003/0119286 A1 | 6/2003 | Im et al. |
| 2003/0139069 A1 * | 7/2003 | Block et al. .................. 438/962 |
| 2003/0148565 A1 | 8/2003 | Yamanaka |
| 2003/0148594 A1 | 8/2003 | Yamazaki et al. |
| 2003/0183270 A1 | 10/2003 | Falk et al. |
| 2003/0194613 A1 | 10/2003 | Voutsas et al. |
| 2003/0196589 A1 | 10/2003 | Mitani et al. |
| 2003/0218171 A1 | 11/2003 | Isobe et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0209447 A1 | 10/2004 | Gosain et al. |
| 2004/0222187 A1 | 11/2004 | Lin |
| 2004/0224487 A1 | 11/2004 | Yang |
| 2005/0003591 A1 | 1/2005 | Takaoka et al. |
| 2005/0032249 A1 | 2/2005 | Im et al. |
| 2005/0034653 A1 | 2/2005 | Im et al. |
| 2005/0059222 A1 | 3/2005 | You |
| 2005/0059223 A1 | 3/2005 | Im |
| 2005/0059224 A1 | 3/2005 | Im |
| 2005/0059265 A1 | 3/2005 | Im |
| 2005/0112906 A1 | 5/2005 | Maekawa et al. |
| 2005/0139830 A1 | 6/2005 | Takeda et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1 | 10/2005 | Im et al. |
| 2005/0236908 A1 | 10/2005 | Rivin |
| 2005/0255640 A1 | 11/2005 | Im et al. |
| 2005/0282319 A1 | 12/2005 | Bruland et al. |
| 2006/0030164 A1 | 2/2006 | Im |
| 2006/0035478 A1 | 2/2006 | You |
| 2006/0040512 A1 | 2/2006 | Im |
| 2006/0060130 A1 | 3/2006 | Im |
| 2006/0102901 A1 | 5/2006 | Im et al. |
| 2006/0125741 A1 | 6/2006 | Tanaka et al. |
| 2006/0134890 A1 | 6/2006 | Im |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0010104 A1 | 1/2007 | Im et al. |
| 2007/0012664 A1 | 1/2007 | Im |
| 2007/0020942 A1 | 1/2007 | Im |
| 2007/0032096 A1 | 2/2007 | Im |
| 2007/0051302 A1 | 3/2007 | Gosain et al. |
| 2007/0054477 A1 | 3/2007 | Kim et al. |
| 2007/0108472 A1 | 5/2007 | Jeong et al. |
| 2007/0111349 A1 | 5/2007 | Im |
| 2007/0145017 A1 | 6/2007 | Im et al. |
| 2007/0184638 A1 | 8/2007 | Kang et al. |
| 2007/0215877 A1 | 9/2007 | Kato et al. |
| 2007/0215942 A1 | 9/2007 | Chen et al. |
| 2008/0035863 A1 | 2/2008 | Im et al. |
| 2008/0124526 A1 | 5/2008 | Im |
| 2008/0176414 A1 | 7/2008 | Im |
| 2009/0001523 A1 | 1/2009 | Im |
| 2009/0137105 A1 | 5/2009 | Im |
| 2009/0140173 A1 | 6/2009 | Im |
| 2009/0218577 A1 | 9/2009 | Im |
| 2009/0242805 A1 | 10/2009 | Im |
| 2009/0309104 A1 | 12/2009 | Im et al. |
| 2010/0024865 A1 | 2/2010 | Shah et al. |
| 2010/0187529 A1 | 7/2010 | Im |
| 2011/0248278 A1 | 10/2011 | Im et al. |
| 2011/0309370 A1 | 12/2011 | Im |

FOREIGN PATENT DOCUMENTS

| | | |
|---|---|---|
| DE | 19839718 | 3/2000 |
| DE | 10103670 | 8/2002 |
| EP | 655774 A2 | 5/1995 |
| EP | 681316 A2 | 11/1995 |
| EP | 1067593 A2 | 1/2001 |
| GB | 2338342 A | 12/1999 |
| GB | 2338343 A | 12/1999 |
| GB | 2338597 A | 12/1999 |
| JP | S57-027035 | 2/1982 |
| JP | 62160781 | 7/1987 |
| JP | 62181419 A | 8/1987 |
| JP | 62216320 | 9/1987 |
| JP | H01-256114 | 10/1989 |
| JP | 2081422 | 3/1990 |
| JP | 2283036 A | 11/1990 |
| JP | 04033327 A | 2/1992 |
| JP | 04-279064 | 10/1992 |
| JP | 5041519 A | 2/1993 |
| JP | 5048190 | 2/1993 |
| JP | 06-011729 | 1/1994 |
| JP | 6252048 A | 9/1994 |
| JP | H06-260502 | 9/1994 |
| JP | 6283422 A | 10/1994 |

(56) References Cited

FOREIGN PATENT DOCUMENTS

| JP | 7176757 | A | 7/1995 |
|---|---|---|---|
| JP | H08-078330 | | 3/1996 |
| JP | H09-007968 | | 1/1997 |
| JP | 9171971 | A | 6/1997 |
| JP | H09-270393 | | 9/1997 |
| JP | 9260681 | A | 10/1997 |
| JP | 9321210 | A | 12/1997 |
| JP | 10189998 | | 7/1998 |
| JP | H10-244390 | | 9/1998 |
| JP | 11025064 | A | 1/1999 |
| JP | 11064883 | A | 3/1999 |
| JP | 11-281997 | | 10/1999 |
| JP | H11-297852 | | 10/1999 |
| JP | 11330000 | A | 11/1999 |
| JP | 2000505241 | A | 4/2000 |
| JP | 2000-315652 | | 11/2000 |
| JP | 2000346618 | | 12/2000 |
| JP | 2001023920 | A | 1/2001 |
| JP | 2000223425 | | 8/2002 |
| JP | 2002-353142 | | 12/2002 |
| JP | 2002353159 | A | 12/2002 |
| JP | 2003-031496 | | 1/2003 |
| JP | 2004031809 | | 1/2003 |
| JP | 2003-509844 | | 3/2003 |
| JP | 20003100653 | | 4/2003 |
| JP | 2004-311935 | | 11/2004 |
| TW | 457553 | B | 10/2001 |
| TW | 464960 | A1 | 11/2001 |
| TW | 564465 | A | 12/2003 |
| TW | 569350 | B | 1/2004 |
| WO | WO-97/45827 | | 12/1997 |
| WO | WO-98/24118 | | 6/1998 |
| WO | WO-99/31719 | | 6/1999 |
| WO | WO-00/14784 | | 3/2000 |
| WO | WO-01/18854 | | 3/2000 |
| WO | WO-01/18855 | | 3/2001 |
| WO | WO-01/71786 | | 9/2001 |
| WO | WO-01/71791 | | 9/2001 |
| WO | WO-01/73769 | A1 | 10/2001 |
| WO | WO-0231869 | A2 | 4/2002 |
| WO | WO-02/42847 | | 5/2002 |
| WO | WO-02/086955 | | 10/2002 |
| WO | WO-0286954 | A1 | 10/2002 |
| WO | WO-03/018882 | | 3/2003 |
| WO | WO-03/046965 | | 6/2003 |
| WO | WO-03/084688 | | 10/2003 |
| WO | WO-2004017379 | A2 | 2/2004 |
| WO | WO-2004017380 | A2 | 2/2004 |
| WO | WO-2004017381 | | 2/2004 |
| WO | WO-2004017382 | A2 | 2/2004 |
| WO | WO-2004075263 | A2 | 9/2004 |
| WO | WO-2005/029551 | | 3/2005 |
| WO | WO-2005029546 | A2 | 3/2005 |
| WO | WO-2005029548 | A2 | 3/2005 |
| WO | WO-2005029550 | A2 | 3/2005 |
| WO | WO-2006/055003 | A1 | 5/2006 |

OTHER PUBLICATIONS

Biegelsen, D.K., L.E. Fennell and J.C. Zesch, Origin of oriented crystal growth of radiantly melted silicon on SiO/sub 2, Appl. Phys. Lett. 45, 546 (1984).
Boyd, I. W., "Laser Processing of Thin Films and Microstructures, Oxidation, Deposition and Etching of Insulators," (Springer-Verlag Berlin Heidelber, 1987.
Broadbent et al., "Excimer Laser Processing of Al-1%Cu/TiW Interconnect Layers," Proceedings, Sixth International IEEE VLSI Multilevel Interconnection Conference, Santa Clara, CA, Jun. 12-13, pp. 336-345 (1989).
Brotherton et al., "Influence of Melt Depth in Laser Crystallized Poly-Si Thin Film Transistors," Journal of Appl. Phys., 82:4086 (1997).
Brotherton, "Polycrystalline Silicon Thin Film Transistors," Semicond. Sci. Tech., 10:721-738 (1995).
Brotherton, S.D., et al., Characterisation of poly-Si TFTs in Directionally Solidified SLS Si, Asia Display/IDW'01, p. 387-390.
Crowder et al., "Low-Temperature Single-Crystal Si TFT's Fabricated on Si Films Processed via Sequential Lateral Solidification," IEEE Electron Device Letter, 19 (8): 306 (1998).
Crowder et al., "Parametric Investigation of SLS-processed Polysilicon Thin Films for TFT Applications," Preparations and Characterization, Elsevier, Sequoia, NL, vol. 427, No. 1-2, Mar. 3, 2003, pp. 101-107, XP004417451.
Crowder et al., "Sequential Lateral Solidification of PECVD and Sputter Deposited a-Si Films", Mat. Res. Soc. Symp. Proc. 621:Q.9.7.1-9.7.6, 2000.
Dassow, R. et al. Laser-Crystallized Polycrystalline Silicon on Glass for Photovoltaic Applications, Solid State Phenomena, pp. 193-198, vols. 67-68, Scitec Publications, Switzerland.
Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.
Dassow, R. et al., Laser crystallization of silicon for high-performance thin-film transistors, Semicond. Sci. Technol., 2000, pp. L31-L34, vol. 15, UK.
Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).
Endert et al., "Excimer Laser: A New Tool for Precision Micromachining," Optical and Quantum Electronics, 27:1319 (1995).
Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993).
Geis et al., "Crystallographic orientation of silicon on an amorphous substrate using an artificial surface-relief grating and laser crystallization," Appl. Phys. Lett. 35(1) Jul. 1, 1979, 71-74.
Geis et al., "Silicon graphoepitaxy using a strip-heater oven," Appl. Phys. Lett. 37(5), Sep. 1, 1980, 454-456.
Geis et al., "Zone-Melting recrystallization of SI Films with a moveable-strip heater oven," J. Electro-Chem. Soc., 129: 2812 (1982).
Gosain et al., "Formation of (100)-Textured Si Film Using an Excimer Laser on a Glass Substrate," Jpn. J. Appl. Phys., vol. 42 (2003) pp. L135-L137.
Gupta et al., "Numerical Analysis of Excimer-laser induced melting and solidification of Si Thin Films", Applied Phys. Lett., 71:99, 1997.
Hau-Riege et al., "The Effects Microstructural Transitions at Width Transitions on interconnect reliability," Journal of Applied Physics, 87(12): 8467-8472.
Hawkins, W.G. et al., "Origin of lamellae in radiatively melted silicon flims," Appl. Phys. Lett. 42(4), Feb. 15, 1983.
Hayzelden, C. and J.L. Batstone, Silicide formation and silicide-mediated crystallization of nickel-implanted amorphous silicon thin films, J. Appl. Phys. 73, 8279 (1993).
Im et al., "Controlled Super-Lateral Growth of Si Films for Microstructural Manipulation and Optimization," Phys. Stat. Sol. (a), 166:603 (1998).
Im et al., "Crystalline Si Films for Integrated Active-Matrix Liquid-Crystals Displays," MRS Bulletin, 21:39 (1996).
Im et al., "On the Super Lateral Growth Phenomenon Observed in Excimer Laser-Induced Crystallization of Thin Si Films," Appl. Phys. Lett., 64 (17): 2303 (1994).
Im et al., "Phase Transformation Mechanisms Involved in Excimer Laser Crystallization of Amorphous Silicon Films," Appl. Phys. Lett., 63 (14): 1969 (1993).
Im et al., "Single-Crystal Si Films for Thin-Film Transistor Devices," Appl. Phys. Lett., 70(25): 3434 (1997).
Im, J.S., Method and system for producing crystalline thin films with a uniform crystalline orientation, application # 60/503419; ref. file # 36013(BB); Columbia ref. M02-063.
Ishida et al., "Ultra-shallow boxlike profiles fabricated by pulsed ultraviolet-laser doping process," J. Vac. Sci. Technol. B 12(1): 399-403, (1994).

(56) References Cited

OTHER PUBLICATIONS

Ishihara et al., "A Novel Double-Pulse Excimer-Laser Crystallization Method of Silicon Thin-Films," Publication Office, Japanese Journal of Applied Physics, Tokyo, Japan, 34(8A): 3976-3981 (1995).
Jeon et al., "New Excimer Laser Recrystalization of Poly-Si for Effective Grain Growth and Grain Boundary Arrangement," Jpn. J. Appl. Phys. vol. 39 (2000) pp. 2012-2014, Part 1, No. 4B, Apr. 2000.
Jeon et al., "Two-step laser recrystallization of poly-Si for effective control of grain boundaries," Journal of Non Crystalline Solids, 266-269: 645-649 (2000).
Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.
Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.
Kahlert, H., "Creating Crystals," OE Magazine, Nov. 2001, 33-35.
Kim et al., "Grain Boundary Location-Controlled Poly-Si Films for TFT Devices Obtained Via Novel Excimer Laser Process," Mat. Res. Soc. Symp. Proc., vol. 358, 1995.
Kim et al., "Multiple Pulse Irradiation Effects in Excimer Laser-Induced Crystallization of Amorphous Si Films," Mat. Res. Soc. Sym. Proc., 321:665-670 (1994).
Kim, "Excimer-Laser-Induced Crystallization of Amorphous Silicon Thin Films," Ph. D. Dissertation Abstract, Columbia University, 1996.
Kim, C. et al., "Development of SLS-Based SOG Display," IDMC 2005, pp. 252-255.
Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.
Kim, H.-J., et al., "The effects of dopants on surface-energy-driven secondary grain growth in silicon films," J. Appl. Phys. 67 (2), Jan. 15, 1990.
Kim, H.J. et al., "New Excimer-laser-crystallization method for producing large-grained and grain boundary-location-controlled Si Films for Thin Film Transistors", Applied Phys. Lett., 68: 1513.
Kimura, M. and K. Egami, Influence of as-deposited film structure on (100) texture in laser-recrystallized silicon on fused quartz, Appl. Phys. Lett. 44, 420 (1984).
Knowles, D.S. et al., "P-59: Thin Beam Crystallization Method: a New Laser Annealing Tool with Lower Cost and Higher Yield for LTPS Panels," SID 00 Digest, pp. 1-3.
Kohler, J.R. et al., Large-grained polycrystalline silicon on glass by copper vapor laser annealing. Thin Solid Films, 1999, pp. 129-132, vol. 337, Elsevier.
Kung, K.T.Y. and R. Reif, Implant-dose dependence of grain size and (110) texture enhancements in polycrystalline Si films by seed selection through ion channeling, J. Appl. Phys. 59, 2422 (1986).
Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683 (1985).
Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190 (1993).
Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657 (1994).
Lee, S.-W. and S.-K. Joo, Low temperature poly-Si thin-film transistor fabrication by metal-induced lateral crystallization, IEEE Electron Device Letters 17, 160 (1996).
Lee, S.-W., Y.-C. Jeon and S.-K. Joo, Pd induced lateral crystallization of amorphous Si thin films, Appl. Phys. Lett. 66, 1671 (1995).
Leonard, J.P. et al, "Stochastic modeling of solid nucleation in supercooled liquids", Appl. Phys. Lett. 78:22, May 28, 2001, 3454-3456.
Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.
Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.
Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on Insulator Devices, Eds. P.L.F. Hemment, Kluwer Academic Publishers 2000, pp. 55-61.
Mariucci et al., "Grain boundary location control by patterned metal film in excimer laser crystallized polysilicon," Proceedings of the Fifth International Conference on Polycrystalline Semiconductors, Schwabisch Gmund, Germany, 67-68: 175-180 (1998).
McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, 43(10): 946-948 (1983).
Micro/LAS Lasersystem GmbH, "Overview of Beam Delivery Systems for Excimer Lasers," (1999).
Micro/LAS Lasersystem GmbH, "UV Optics Systems for Excimer Laser Based Micromachining and Marking," (1999).
Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944 (2002).
Miyata et al, "Low-Temperature Polycrystalline Silicon Thin-Film Transistors for Large-Area Liquid Crystal Display," Japanese J. of Applied Physics, Part 1—Regular Papers Short Notes & Review Papers, 31:4559-62 (1992).
Nebel, "Laser Interference Structuring of A-Si:h" Amorphous Silicon Technology—1996, San Francisco, CA Apr. 8-12, Materials Research Society Symposium Proceedings, vol. 420, Pittsburgh, PA (1996).
Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).
Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993).
Ozawa et al., "Two-Dimensionally Position-Controlled Excimer-Laser-Crystallization of Silicon Thin Films on Glassy Substrate," Jpn. J. Appl. Phys. 38(10):5700-5705 (1999).
Sato et al., "Mobility anisotropy of electrons in inversion layers on oxidized silicon surfaces," Physical Review B (State) 4, 1950 (1971).
Smith, H.I. et al, "The Mechanism of Orientation in Si Graphoepitaxy by Laser Strip Heater Recrystallization," J. Electrochem. Soc.: Solid-State Science and Technology, vol. 130, No. 10, Oct. 1983, pp. 2050-2053.
Song et al., "Single Crystal Si Islands on SiO2 Obtained Via Excimer Laser Irradiation of a Patterned Si Film", Applied Phys. Lett., 68:3165, 1996.
Sposili et al., "Line-scan sequential lateral solidification of Si thin films", Appl. Phys. A67, 273-6, 1998.
Sposili et al., "Sequential Lateral Solidification of Thin Silicon Films on SiO2," Appl. Phys. Lett., 69(19): 2864 (1996).
Sposili et al., "Single-Crystal Si Films via a Low-Substrate-Temperature Excimer-Laser Crystallization Method," Mat. Res. Soc. Symp. Proc., 452: 953-958 (1997).
Thompson, C.V. and H.I. Smith, Surface-energy-driven secondary grain growth in ultrathin (<100 nm) films of silicon, Appl. Phys. Lett. 44, 603 (1984).
van der Wilt, P.C. et al., "State-of-the-Art Laser Crystallization of Si for Flat Panel Displays," PhAST, May 18, 2004, pp. 1-34.
van der Wilt, P.C. et al., "The Commercialization of the SLS Technology," Taiwan FPD, Jun. 11, 2004, pp. 1-12.
van der Wilt, P.C., "Textured poly-Si films for hybrid SLS," Jul. 2004, pp. 1-5.

(56) References Cited

OTHER PUBLICATIONS

Voutsas, A. T., "Assessment of the Performance of Laser-Based Lateral-Crystallization Technology via Analysis and Modeling of Polysilicon Thin-Film-Transistor Mobility," IEEE Transactions on Electronic Devices, vol. 50, No. 6, Jun. 2003.

Voutsas, A.T. et al.: "Effect of process parameters on the structural characteristics of laterallyy grown, laser-annealed polycrystalline silicon films," Journal of applicaed Physics, vol. 94, No. 12, Dec. 15, 2003.

Voutsas, A.T., A new era of crystallization: advances in polysilicon crystallization and crystal engineering, Applied Surface Science 250-262, 2003.

Watanabe et al., "Crystallization Process of Polycrystalline Silicon by KrF Excimer Laser Annealing," Japanese J. of Applied Physics, Part 1—Regular Papers Short Notes & Review Papers, 33:4491-98 (1994).

Weiner, K. H. et al. "Laser-assisted, Self-aligned Silicide Formation," A Verdant Technologies technical brief, Aug. 7, 1997, 1-9.

Weiner, K. H. et al., "Ultrashallow Junction Formation Using Projection Gas Immersion Laser Doping (PGILD)," A Verdant Technologies Technical Brief, Aug. 20, 1997.

Werner, J.H., et al. From polycrystalline to single crystalline silicon on glass, Thin Solid Films 383, 95-100, 2001.

White et al., "Characterization of thin-oxide MNOS memory transistors," IEEE Trans. Electron Devices ED-19, 1280 (1972).

Yamamuchi et al., "Polycrystalline silicon thin films processed with silicon ion implantation and subsequent solid-phase crystallization: Theory, experiments, and thin-film transistor applications," Journal of Applied Physics, 75(7):3235-3257 (1994).

Yoshimoto et al., "Excimer-Laser-Produced and Two-Dimensionally Position-Controlled Giant Si Grains on Organic SOG Underlayer," p. 285-286, AM-LCD (2000).

International Search Report and Written Opinion issued for corresponding International Patent Application No. PCT/US2008/077199.

International Search Report for corresponding International Patent Application No. PCT/US2010/033565, mailed Jul. 1, 2010, 1 page.

International Search Report for corresponding International Patent Application No. PCT/US2010/055106, mailed Jan. 4, 2011, 1 page.

Andrä et al., "A new technology for crystalline silicon thin film solar cells on glass based on the laser crystallization," IEEE, pp. 217-220 (2000).

Andrä et al., "Multicrystalline LLC-SI thin film solar cells on low temperature glass," Poster, 3rd world Conference on Photovoltaic Energy Conversion, Osaka, Japan, pp. 1174-1177, May 11-18, 2003.

Sinke et al., "Explosive crystallization of amorphous silicon: Triggering and propagation," Applied Surface Science, vol. 43, pp. 128-135 (1989).

Van Der Wilt, "A hybrid approach for obtaining orientation-controlled single-crystal Si regions on glass substrates," Proc. of SPIE vol. 6106, 61060B-1 to B-15, (2006).

* cited by examiner

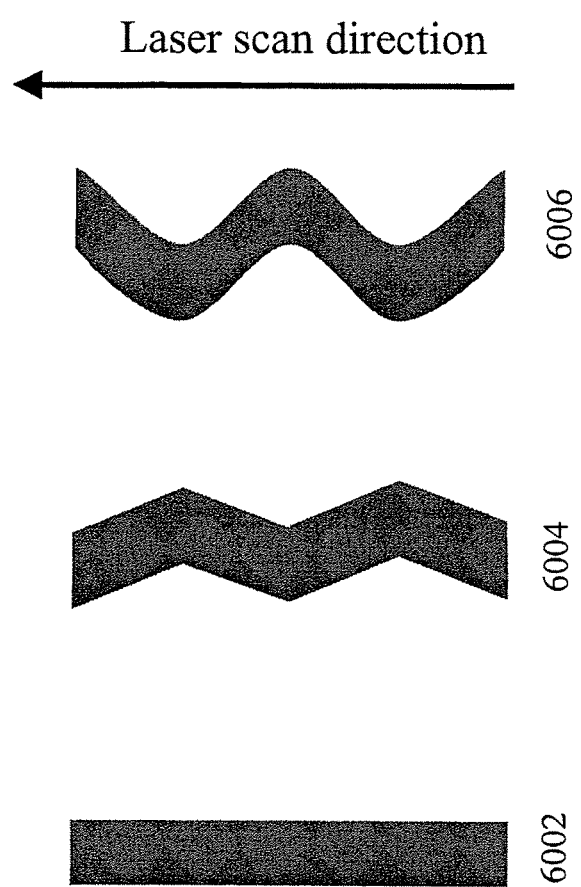

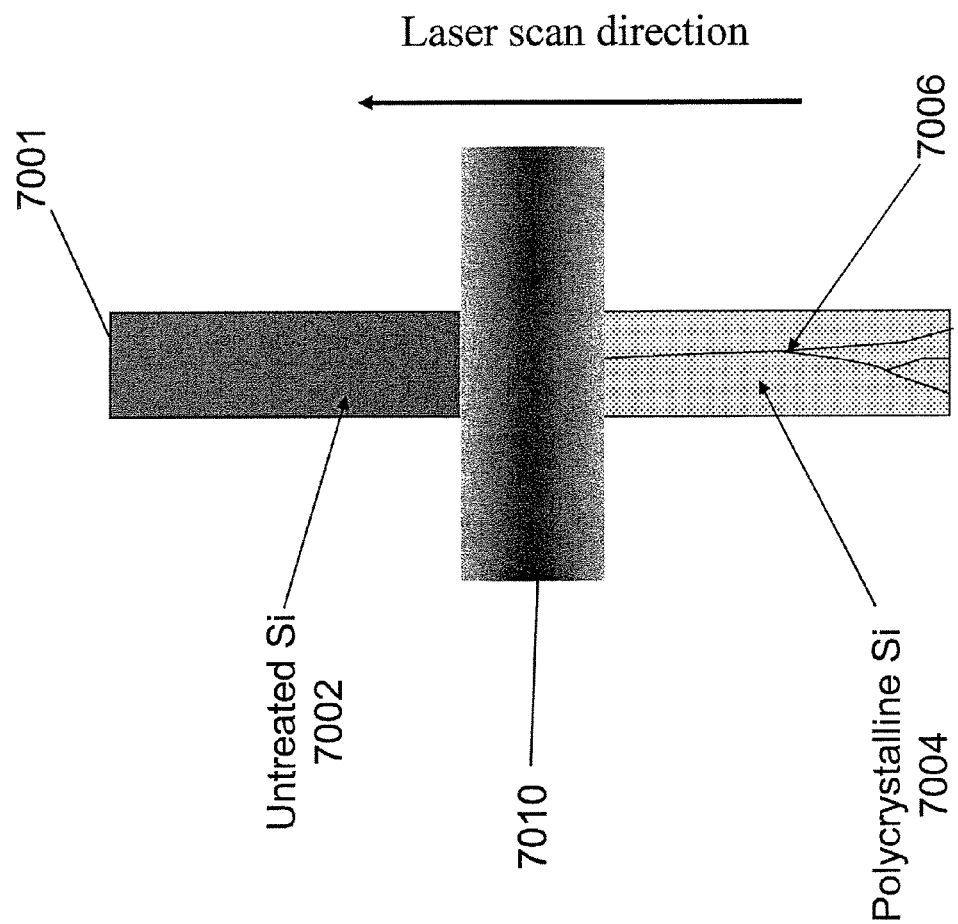

Uniform

Single-crystal islands

Random

Directional

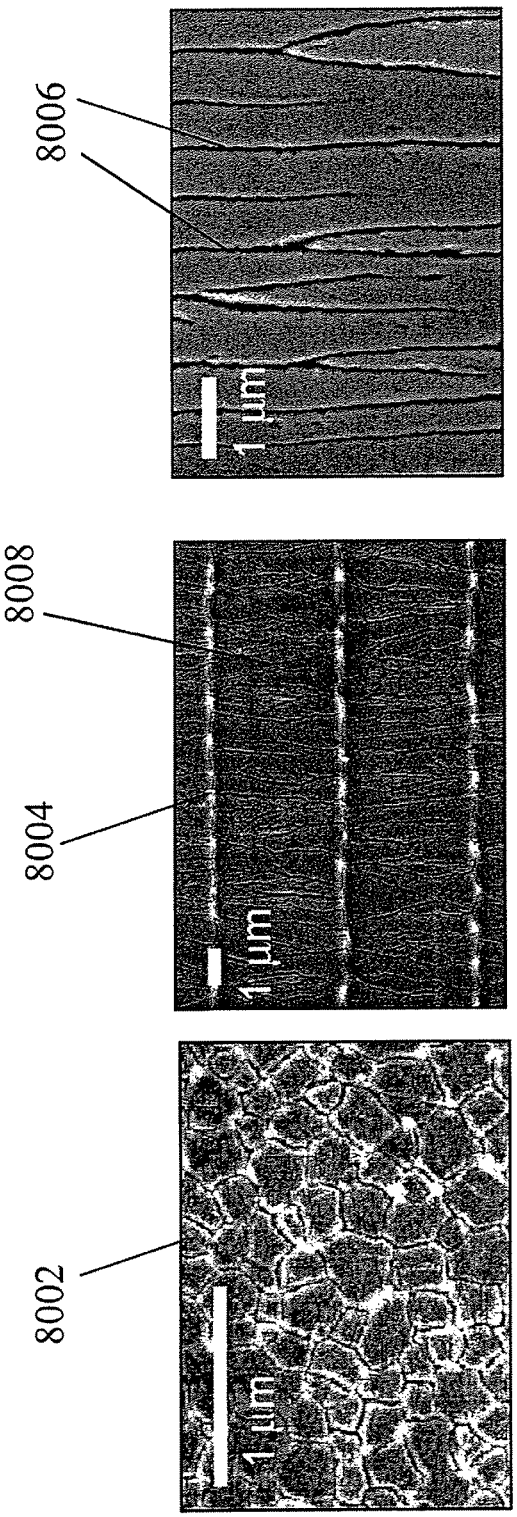

COLLECTIONS OF LATERALLY CRYSTALLIZED SEMICONDUCTOR ISLANDS FOR USE IN THIN FILM TRANSISTORS

This application is a U.S. National Phase application under 35 U.S.C. §371 of International Patent Application No. PCT/US2008/077199 filed Sep. 22, 2008, which claims the benefit under 35 U.S.C. 119(e) of U.S. Provisional Patent Application No. 60/994,692 filed Sep. 21, 2007, each of which is hereby incorporated by reference in its entirety.

FIELD

The disclosed subject matter generally relates to laser crystallization of thin films and particularly relates to utilizing such films in making thin film transistors.

BACKGROUND

In recent years, various techniques for crystallizing or improving the crystallinity of an amorphous or polycrystalline semiconductor film have been investigated. Such crystallized thin films can be used in the manufacture of a variety of devices, such as image sensors and active-matrix liquid-crystal display ("AMLCD") devices. In the latter, a regular array of thin-film transistors ("TFTs") is fabricated on an appropriate transparent substrate, and each transistor serves as a pixel controller.

Crystalline semiconductor films, such as silicon films, have been processed to provide pixels for liquid crystal displays using various laser processes including excimer laser annealing ("ELA") and sequential lateral solidification ("SLS") processes. SLS is well suited to process thin films for use in AMLCD devices, as well as active-matrix organic light emitting diode (AMOLED) devices.

In ELA, a region of the film is irradiated by an excimer laser to partially melt the film, which subsequently crystallizes. The process typically uses a long, narrow beam shape that is continuously advanced over the substrate surface, so that the beam can potentially irradiate the entire semiconductor thin film in a single scan across the surface. ELA produces small-grained polycrystalline films; however, the method often suffers from microstructural non-uniformities, which can be caused by pulse to pulse energy density fluctuations and/or non-uniform beam intensity profiles. FIG. 8A illustrates a random microstructure that can be obtained with ELA. The Si film is irradiated multiple times to create the random polycrystalline film with a uniform grain size. This figure, as well as all other figures, are not drawn to scale, and are intended to be illustrative in nature. FIG. 8E, is a top view SEM image of a film process via ELA and shows the random microstructure of the film, containing randomly located grain boundaries 8002.

SUMMARY

The application describes collections of laterally crystallized semiconductor islands for use in thin film transistors and systems and methods for making same.

According to one aspect of the application, a display device is provided. The display device includes a plurality of thin film transistors (TFTs) on a substrate. The TFTs are spaced apart from each other and each include a channel region that has a crystalline microstructure and a direction along which a channel current flows. The channel region of each of the plurality of the TFTs contains a crystallographic grain that spans the length of that channel region along its channel direction. Further, each crystallographic grain in the channel region of each of the plurality of TFTs is physically disconnected from and crystallographically uncorrelated with each crystallographic grain in the channel region of each adjacent TFT.

According to another aspect of the application, in the display device the channel region of each of the plurality of TFTs includes a plurality of crystalline stripes, each spanning the length of the channel region along its channel direction. Moreover each crystalline stripe of the plurality of stripes is physically disconnected from and crystallographically uncorrelated with other stripes of the plurality of stripes in that channel region or in the channel regions of adjacent TFTs.

According to another aspect of the application, in the display device, one or more of the plurality of crystalline stripes are nano-wires.

According to another aspect of the application, in the display device, one or more of the plurality of stripes is a non-straight stripe, wherein each of the non-straight stripes connects a first base line portion to a second base line portion, while not covering the whole area of the quadrilateral formed by the first and the second base line portions and a first and a second side line portions, wherein the first side line portion connects a first end of the first base line portion with a first end of the second base line portion, and wherein the second side line portion connects a second end of the first base line portion with a second end of the second base line portion.

According to another aspect of the application, in the display device, outside the plurality of the TFTs, the substrate is covered by a material different from the material used by the TFTs.

According to another aspect of the application, in the display device also contains a capping layer on top of the plurality of TFTs.

According to another aspect of the application, in the display device, the channel region of each of the plurality of TFTs contains crystallized silicon.

According to another aspect of the application, in the display device, the channel region of each of the plurality of TFTs includes a source region at one end and a drain region at the other end. Further, each channel region of the plurality of channel regions includes a plurality of crystalline stripes. Moreover, for each channel region, each stripe spans the length of that channel region between the source region and the drain region, and inside the source region and the drain region, each crystalline stripe is physically connected to an adjacent crystalline stripe, and each of the plurality of crystalline stripes of each channel region is physically disconnected from and crystallographically uncorrelated with each of the plurality of crystalline stripes in the channel regions of adjacent TFTs.

According to yet another aspect of the application, an article, used in manufacturing display devices, is provided. The article comprises a substrate and a plurality of crystalline islands located on substrate and spaced apart from each other. Each of the plurality of crystalline islands includes a crystallographic grain that spans the whole length of one dimension of that crystalline island. Also, each crystallographic grain in each of the plurality of crystalline islands is physically disconnected from and crystallographically uncorrelated with each crystallographic grain in each adjacent crystalline island.

According to another aspect of the application, in the article, each crystalline island includes a plurality of crystalline stripes, each spanning the whole length of one dimension of that crystalline island, and each crystalline stripe of the plurality of stripes is physically disconnected from and crystallographically uncorrelated with other stripes in the plurality of stripes in that crystalline island or in the adjacent crystalline islands.

According to another aspect of the application, in the article, one or more of the plurality of crystalline stripes are nano-wires.

According to another aspect of the application, in the article, one or more of the plurality of stripes is a non-straight stripe. Each of the non-straight stripes connects a first base line portion to a second base line portion, while not covering the whole area of the quadrilateral formed by the first and the second base line portions and a first and a second side line portions, wherein the first side line portion connects a first end of the first base line portion with a first end of the second base line portion, and wherein the second side line portion connects a second end of the first base line portion with a second end of the second base line portion.

According to another aspect of the application, in the article, outside the plurality of crystalline islands, the substrate is covered by a material different from the material used by crystalline islands.

According to yet another aspect of the application, a method of manufacturing display devices comprised of a plurality of thin films transistors (TFTs) on a substrate is disclosed. The method comprises the steps of adding a amorphous or multicrystalline silicon layer over the substrate; patterning the silicon layer into a plurality of silicon islands that are physically disconnected; crystallizing the plurality of silicon islands by applying line scan sequential lateral solidification; and fabricating the plurality of TFTs, wherein each TFT uses one or more of the plurality of silicon islands and wherein none of the plurality of silicon islands is used by two of the plurality of TFTs.

According to another aspect of the application, in the method, patterning the silicon layer is comprised of depositing a photoresist on the substrate, exposing the photoresist to a light patterned in accordance with the shapes and locations of the plurality of silicon islands, developing the photoresist, and etching away the content of the silicon layer outside the location of the plurality of silicon islands.

According to another aspect of the application, in the method, patterning the silicon layer includes patterning the silicon layer into a plurality of islands, each of which includes a plurality of stripes, each stripe spanning one dimension of the corresponding island, wherein each stripe of the plurality of stripes is physically disconnected from other stripes of the plurality of stripes in the corresponding island or in adjacent islands.

According to another aspect of the application, in the method, one or more of the plurality of stripes are nano-wires.

According to another aspect of the application, in the method, line scan sequential lateral solidification uses a laser beam that is shaped as a rectangle and wherein the angle between the long axis of the rectangle and the long axis of the plurality of stripes is more than zero degrees.

According to another aspect of the application, the method also includes covering the plurality of islands with a capping layer before applying line scan sequential lateral solidification.

According to another aspect of the application, in the method, the capping layer includes silica.

BRIEF DESCRIPTION OF DRAWINGS

In the Drawing:

FIG. 6A shows a schematic illustration of a variety of shapes of laterally crystallized semiconductor islands, according to some embodiments;

FIG. 7A is a schematic illustration of a perpendicularly oriented laser beam used to crystallize a semiconductor island, according to some embodiments;

FIG. 8E, is a top view SEM image of a film process via ELA;

FIG. 8F is a top view SEM image of a film with a uniform microstructure;

FIG. 8G is a top view SEM image of a film with a directional microstructure;

DETAILED DESCRIPTION

SLS is a pulsed-laser crystallization process that can produce high-quality polycrystalline films having large and uniform grains on substrates, including substrates that are intolerant to heat such as glass and plastics. Exemplary SLS processes and systems are described in commonly-owned U.S. Pat. Nos. 6,322,625, 6,368,945, 6,555,449, and 6,573,531, the entire contents of which are incorporated herein by reference.

Figure 8B:
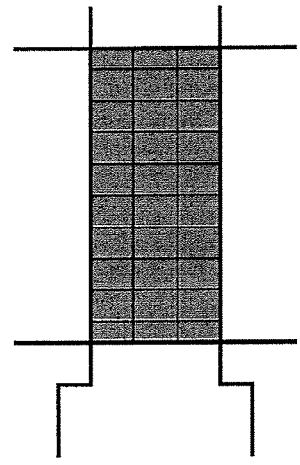
FIGS. 8B-8D illustrate TFTs formed within films having crystalline microstructures formed by sequential lateral solidification.
Figure 8D:
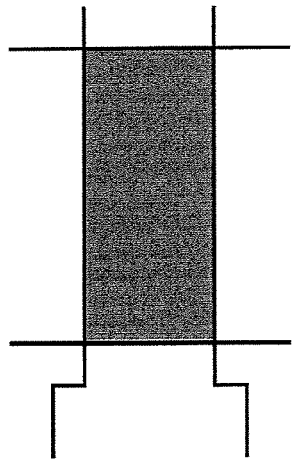
Figure 8A:
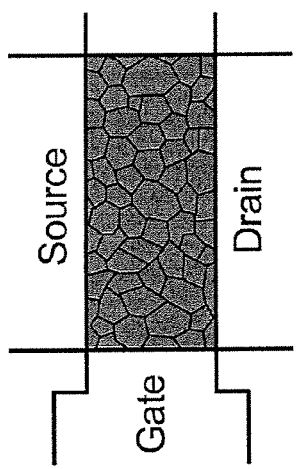
FIG. 8A is a schematic illustration of a TFT formed within a film having a crystalline microstructure formed by excimer laser annealing.
Figure 8C:
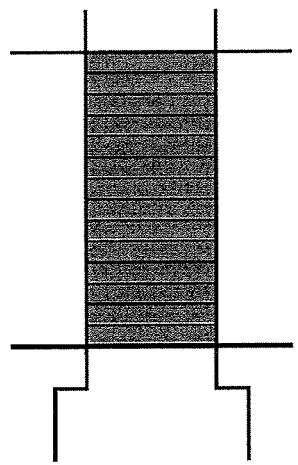

SLS uses controlled laser pulses to melt a region of an amorphous or polycrystalline thin film on a substrate. The melted region then crystallizes from the solid-melt interface into a laterally solidified columnar structure or a plurality of location-controlled large single-crystal regions. Generally, the melt/crystallization process is sequentially repeated over the surface of a large thin film, with a large number of laser pulses. The processed film on substrate is then used to produce one large display, or even divided to produce multiple displays. FIG. 8B is a schematic drawing of a TFT fabricated within a film having a "uniform" microstructure created with SLS methods, e.g., the "2 Shot" SLS method. FIG. 8F is a top view SEM image of a film with a uniform microstructure, showing the perpendicular grain boundaries 8004 and horizontal grain boundaries 8008. FIG. 8C is a schematic drawing of a TFT fabricated within a film having a "directional" microstructure created with SLS. FIG. 8G is a top view SEM image of a film with a directional microstructure, showing horizontal grain boundaries 8006. FIG. 8D is a schematic drawing of a TFT fabricated within a film having a single crystal structure created with SLS.

When a polycrystalline material is used to fabricate devices having TFTs, the total resistance to carrier transport within the TFT channel can be affected by the combination of high resistance barriers that a carrier has to cross as it travels under the influence of a given potential. Within a material processed by some SLS schemes, such as 2-shot SLS or directional SLS, a carrier crosses many more grain boundaries if it travels perpendicular to the long grain axes of the polycrystalline material, and thus experiences a higher resistance, than if it travels parallel to the long grain axes. Thus, in general, the performance of TFT devices fabricated on SLS-processed polycrystalline films depends on the microstructure of the film in the channel.

The typical type, size, density, and distribution of defects in a directionally crystallized film formed via SLS methods can vary in different locations on the film. As crystal grains grow along the direction of the laser scan, grain boundaries form and grow, and regions of different crystallographic textures, or regions with high concentrations of crystallographic defects can also form and grow along that direction inside one or more grains.

The resulting positional variation in grain boundaries and defects can cause a non-uniformity in performance among different TFTs fabricated from the directionally crystallized film. In addition, it can result in a correlation in performance among TFTs that are closely located, for example, TFTs that are located next to each other along the direction of the scan. A correlation in performance means that there is an elevated likelihood that neighboring TFTs will share similar performance characteristics. Correlations typically increase as the TFT sizes decrease, since for smaller TFTs regions of similar orientation and defectiveness can span multiple TFTs. For a small TFT that contains a larger than average number of defects, its neighbors have a higher than random probability of containing a larger than average number of defects. And, for a small TFT that contains a smaller than average number of defects, its neighbors have a higher than random probability of containing a smaller than average number of defects.

Non-uniformity of TFT performance can cause non-uniformities that are noticeable. For example, in display devices non-uniform TFTs can cause non-uniform pixel brightness. In addition, and potentially even more visible, correlations between neighboring TFTs, or more generally between TFTs that are located close to each other, give rise to a systematic non-uniformity in performance and a degradation in quality that can also be noticeable at macroscopic level. In some systems utilizing TFTs, for example in some display systems, it is useful to reduce such correlations and resulting macroscopic non-uniformity.

In order to reduce the correlation and non-uniformity in performance, one or more factors that result in crystal grain growth (and corresponding crystallographic defects) between adjacent TFTs are disconnected. In some embodiments, an amorphous or polycrystalline film is first patterned into disconnected islands, and SLS crystallization is performed afterwards on the disconnected islands. Since the islands are physically disconnected, during SLS crystallization the grains will not span from the area corresponding to one TFT to the next, and thus crystallization (and concomitant defect formation and concentration) will start anew in each island, i.e., the crystallization is disconnected and uncorrelated between different islands. Each island spans the area of a portion or all a single TFT. Moreover, each TFT region, or more specifically the channel region of each TFT, covers early stages of crystallization, during which the crystallographic orientations of grains and intragrain defect density distributions are random and have not stabilized. As a result, the performance of each TFT is approximately random and will not correlate with other TFTs. Moreover the performance of each TFT is the result of averaging the properties of random early grains that the TFT channel region contains. Thus the overall performance is altogether uniform at a macroscopic level. The result is a more random distribution of defects among pixels and thus an overall more uniform quality among the pixels. In some embodiments, specific shapes of the islands are utilized, in order to increase the randomness of the defects. In some embodiments, the angle of irradiation is changed (tilted) with respect to the TFTs to achieve a further reduction in correlated defects. In yet other embodiments, the tilted irradiation line is utilized on patterned islands in order to combine both effects.

Figure 11:
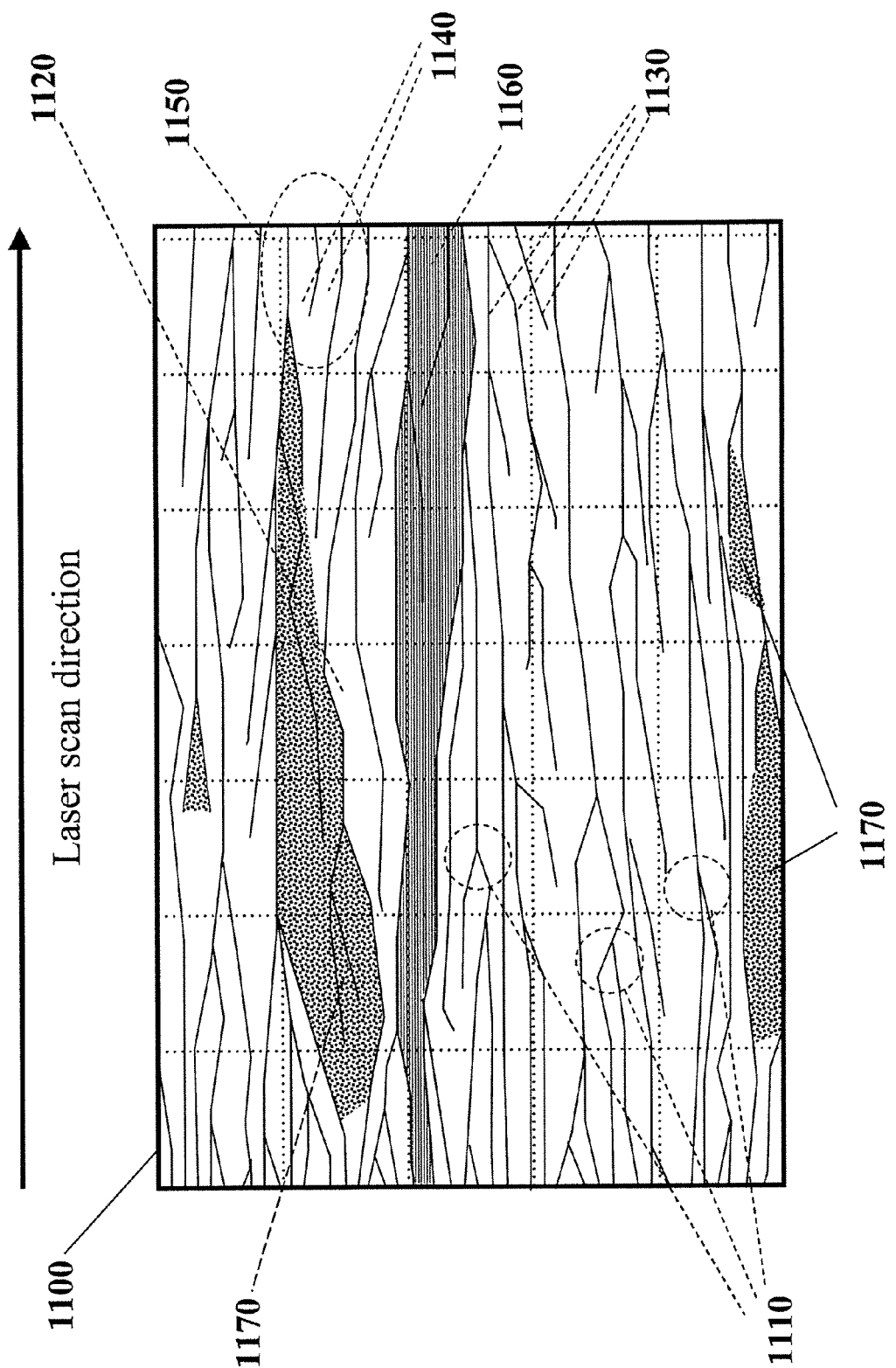
FIG. 11 is a schematic illustration of a region of a crystallized film using the directional line scan SLS.

The variation in the characteristics of grains crystallized by directional SLS are considered in detail. FIG. 11 shows a schematic of a region 1100 of such a film, crystallized at an early stage of a directional SLS mechanism. The type and density of the defects shows a systematic change as the scan progresses from left to right. Specifically on the left hand side, at the very early stages of crystal growth, there can be more instances of occlusions 1110, where a grain stops growing when its two boundaries meet and at least one of these boundaries terminates. As the scan progresses to the right, many of the remaining grains 1120 continue to grow to the right and at the same time widen perpendicular to this growth direction. At the same time, as they get wider, there appear more and more instances of sub-boundaries 1130. These sub-boundaries, bound subgrains 1140, growing within the same main grain 1120. Due to the interplay between occlusion and sub grain generation, the grain widening reaches a steady state and the average subgrain width stabilizes in early stages of SLS.

The group of subgrains 1140 all growing out of the same grain 1120 and thus originating from the same seed, constitute a "metagrain" region 1150. Directional-SLS-processed Si films are typically composed mostly of (100) and/or (110) textured "metagrains" in the direction of the scan or "rolling direction" (RD). Metagrain regions typically include multiple subgrains that originate from a single seed and which, as such, are crystallographically related. They have approximately similar (but not necessarily identical) in-plane orientations in the direction of the scan. The presence of metagrains generated during the scan can introduce some level of heterogeneity in the film. Metagrains typically appear during the gradual widening of those initial grains that have a preferential orientation for lateral growth. However, the widening results in defect formation (mostly via sub-boundary formation but also via twinning) and the grain breaks down in a multitude of subgrains that are still crystallographically related. This is mostly visible in a very similar in-place orientation in the direction of the scan (the rolling direction, RD), but even the surface orientation is not entirely randomized. The average width of the subgrains stays relatively constant and is experimentally found to be related to the thickness of the film, and for example can be about 0.5 μm for 100 nm thick films and less for thinner films.

While metagrains can develop and sustain (100)-RD or (110)-RD crystallographic texture in the scanning direction, the crystallographic orientation of subgrains can gradually change during growth. The nature of "intra-subgrain" defects (i.e. defects within the subgrains that together form a metagrain) is related to the RD orientation of the grain. Thus, the nature of intra-subgrain defects can be similar within all the subgrains of one metagrain, but can be distinctive from those in another metagrain. For example, (110)-RD textured metagrains tend to form closely spaced twin boundaries, whereas (100)-RD textured metagrains typically include different subgrains with a range of defects, including clean/defect-free grains as well as highly defective grains containing stacking faults. In the latter type of metagrains, defective grains are typically those with the misorientations of between about 15° of <100> RD and within about 30° of the <100> RD, whereas defect-free grains are oriented within about 15° of <100> RD or within about 20° of <100> ND (the surface normal direction). The (110)-RD metagrains include subgrains having numerous twin boundaries that run approximately parallel to the scanning direction, while the <100>-RD metagrains include subgrains possessing varying concentrations of defects.

The average subgrain width is typically established rather rapidly as the scan proceeds, in a dynamic manner involving constant generation and convergence of subgrain boundaries. In contrast to this, the average width of the metagrains was found to linearly increase with increasing scan/growth distance and a ratio of about 1:20 for width to length has been observed for typical SLS conditions. Consequently, the average number of subgrains within one metagrain can monotonically increase in a linear fashion as a function of the scan distance.

However, due to twinning, it is possible that within a metagrain of one preferential orientation (e.g. <110> RD orientation), a grain with the other preferential orientation (e.g. <100> RD orientation) is generated and subsequently seeds the growth of a region within the metagrain with a different orientation and corresponding defect distribution/nature. At the same time, metagrains with similar RD orientations can merge into a larger region with one texture. Thus, the width of the textured regions is typically not the same as that of the metagrains. Experimental measurements indicate that most of the grains, for example those depicted in the schematic of FIG. 11, represent (100)-RD metagrains. The shaded area 1160, on the other hand, represents a (110)-RD metagrain formed inside these grains. This type of metagrain can contain a high level of twin type intragrain defects. As a grain grows, other types of defects, for example stacking faults, can also form inside a grain. For example, in FIG. 11, the dotted areas 1170 represent some defective subgrains within the (100)-RD metagrains which contain a high level of stacking faults and other types of intragrain defects.

Defects such as grain boundaries, twin boundaries and stacking faults can negatively impact the number of carriers and their transport, thus affecting the performance of TFTs built over the region containing the defect. Regions like 1160 or 1170, which contain defects and inhomogeneities, can expand along the direction of scan and can become very wide. TFTs on defective areas show poorer performance compared to TFTs in less defective areas. For small size TFTs, multiple TFTs might fit within similarly oriented and defective regions. If these regions are large enough to be macroscopically discernible, the difference between the performance of the TFTs in different regions will affect the quality of the devices utilizing those TFTs, for example, causing visible variations in brightness across a display device.

As TFTs get smaller, the impact of film heterogeneity on the overall performance increases. As the technology progresses, and as the number of pixels per unit area increases, the size of each pixel TFT decreases as well. For example, pixel TFTs for LCDs can have widths of 5 μm or even less. TFTs in integration areas or in OLEDs are typically larger. As long as TFTs are so large that each covers a large number of different metagrains, the average number and characteristics of defects in each TFTs can be random and approximately similar to each other. Thus for large TFTs, the variation in performance can be small among pixels and this results in an overall uniform performance across the substrate. The outcome can be different when the ratio of the TFT size to the grain size decreases, due to TFTs getting smaller, or grains getting larger, which is the case for grains generated in directionally crystallized films.

When TFTs are so small that their sizes are of the order of the sizes of the metagrains, the average number and characteristics of defects in a TFT as well as the overall crystallographic orientation distribution in a TFT, can be a function of its location within the film. The number and type of defects and thus the performance of TFTs located near each other, within one type of metagrain, will be correlated. The performance of pixels, specially the OLED pixel controller TFTs can be sensitive to the density and type of crystal defects. Subsequently, among other things, this can cause a variation in pixel brightness across a display using the TFTs on a directionally crystallized silicon film. For example, due to this non-uniformity, pixels on the (100)-RD metagrains show different performance compared to pixels on the (110)-RD metagrains. The difference in brightness can cause patterns in accordance with location of metagrains on the display. In general, when the size of heterogeneities, e.g., grain boundaries, in the crystal is around the same scale or larger than a dimension of the device, e.g., the TFT, then multiple devices may fall within a region of the film containing the same or correlated heterogeneities. Then, the performances of these nearby devices will be correlated, or, their performances is not in the average similar to the performance of devices in other regions of the film.

FIG. 11 also depicts a schematic example of the layout of TFTs with respect to the grains. The TFTs are shown as a dotted line grid overlaying the film region 1100. Each grid cell represents the channel area that can be used by one TFT. FIG. 11 demonstrates the relative location and size of TFT channels with respect to grains. In some embodiments not all gird cells are necessarily utilized in manufacturing a device. As seen in FIG. 11, while moving from TFTs in the left columns to those in the right columns, the average number of occlusions located in a TFT decreases systematically while the number of subgrain boundaries increases systematically. The performance of a TFT is negatively affected by the number of grain boundaries covered by it. Also the performance of a TFT located in regions 1160 and 1170 is negatively affected due to the inhomogeneities and defects formed in these regions. Since defective regions of (110)-RD metagrains like 1160 generally grow along the direction of the scan, that is from left to right in FIG. 11, TFTs located along this direction on this region show a similar performance degradation. In general, if a TFT has a performance that is above the average, its neighbors along the direction of the scan have a higher than random chance having a performance that is above the average. And, if a TFT has a performance that is below the average, its left and right neighbors along the direction of scan have a higher than random chance of having a performance that is below the average. This causes a correlation among neighboring cells and in general cells located close to each other and along the direction of the scan, which creates a systematic variation of the performance of TFTs at a macroscopic level across the substrate.

In order to reduce the non-uniformity among TFTs and the correlation among their performances, before crystallization, TFT channel regions are prepared as spaced apart elements on a substrate. The separation prevents the growth of correlated crystals such as metagrains between different TFTs. In some embodiments, the silicon film is patterned into areas or islands the length of which are chosen to be sufficiently short such that metagrain or textured regions typically do not expand to the entire island. Moreover, crystallization starts anew in each island, and each island represents early stages of crystallization which has a generally random defect structure.

In other embodiments the patterned islands are on the order of one TFT or part of a TFT, such that each TFT is formed of one or more islands that are crystallographically disconnected from adjacent islands. Thus, crystal defects for each TFT are independent and not correlated to the crystal defects for another TFT. In some embodiments, the amorphous or polycrystalline silicon is provided only in those patterned islands allocated for each TFT. The remaining material around the amorphous silicon island could either be air or another gas, or it could be some non-crystallizable material, or amorphous silica that is separated physically from the TFT area. In some embodiments, the laser scan is performed across a large area or even the entire surface, covering one or more of the TFT locations. Each TFT location will melt and crystallize within crystal grains that form substantially independent from grains in the rest of the film. Using the patterned silicon film can, for example, reduce the size of the metagrains and increase the variety of defects formed inside each TFT device.

Figure 1A:
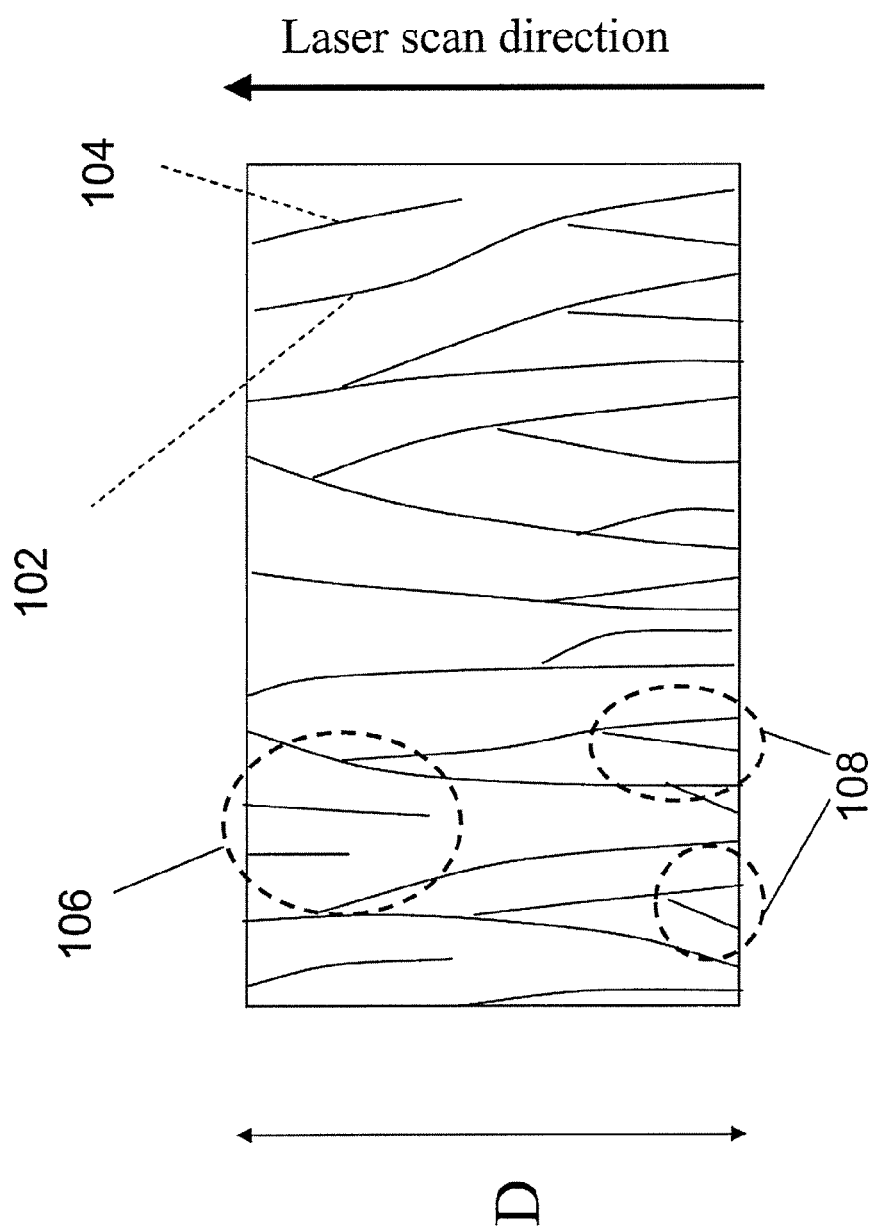
FIG. 1A is a schematic illustration of a laterally crystallized rectangular semiconductor island, according to some embodiments.

FIG. 1A is a schematic illustration of a laterally crystallized rectangular semiconductor island that can be subsequently used for TFT fabrication, according to some embodiments. As the laser scan proceeds, for example from bottom to top, the lateral crystallization starts at the edge of the island that is first hit by the pulsed beam, for example at the bottom edge. Some grain boundaries like 102 grow generally in the same direction as that of scan, and some new grain boundaries, like 104 appear inside a grain, signifying the appearance of a new subgrain. Region 106 is an example of a metagrain having three such subgrains, which together define the metagrain inside a grain which originated at the start of the scan at the bottom. The total area of the island is crystallized using directional line-scan SLS, and the total scan distance, in this example the distance D from bottom to top, is sufficiently short that at the end of the scan the metagrain width will be generally smaller than island width.

Figure 1B:
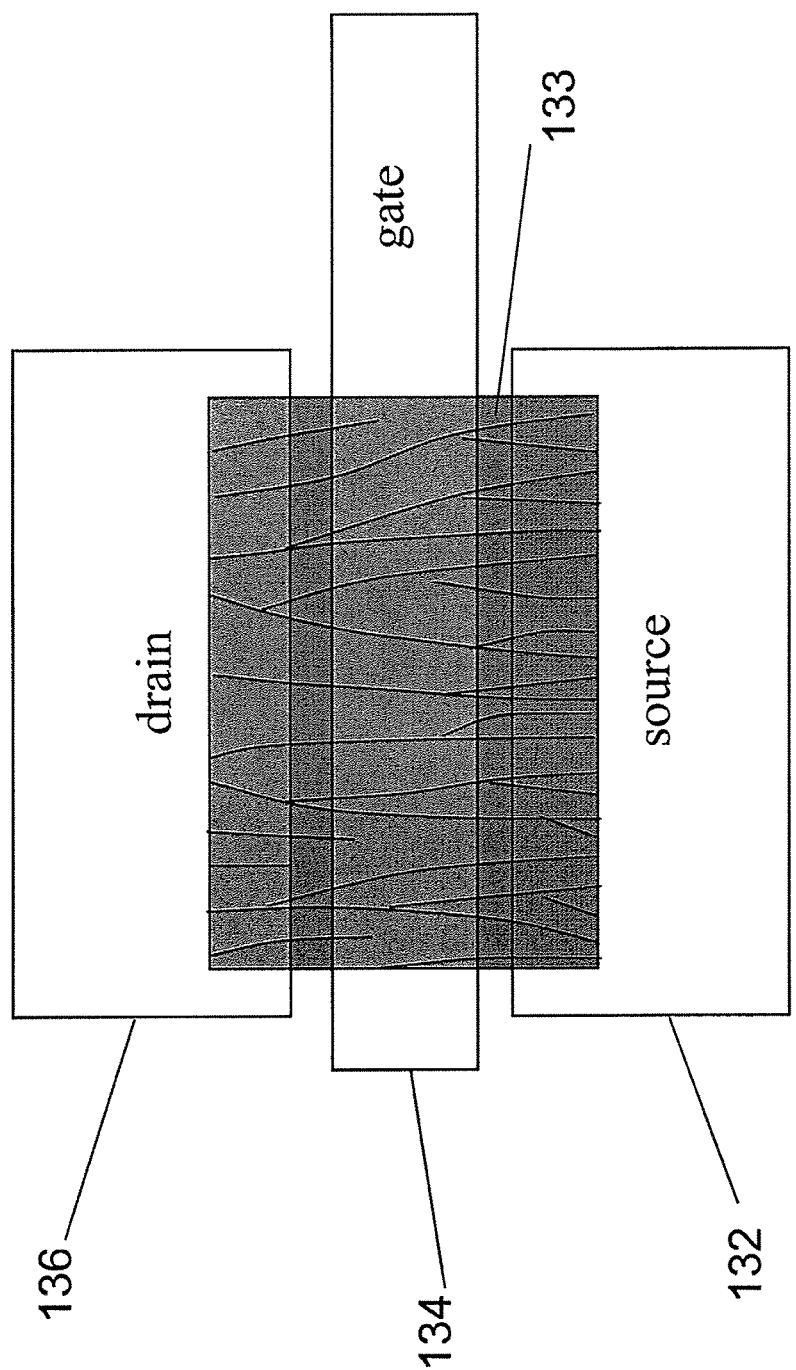
FIG. 1B is a schematic illustration of a TFT device fabricated using a laterally crystallized semiconductor island according to some embodiments.

FIG. 1B is a schematic illustration of a TFT device fabricated using a laterally crystallized semiconductor island according to some embodiments. FIG. 1B shows an example of a TFT metallines for gate 134, source 132 and drain 136 in relation to an island 133 similar to that of FIG. 1A. In some embodiments, the area of the island under the gate has a different doping level compared to the rest of the island. For example the source and drain areas might be highly p-doped areas, while the grain area under the gate might be not doped, or be only lightly doped.

Figure 1C:
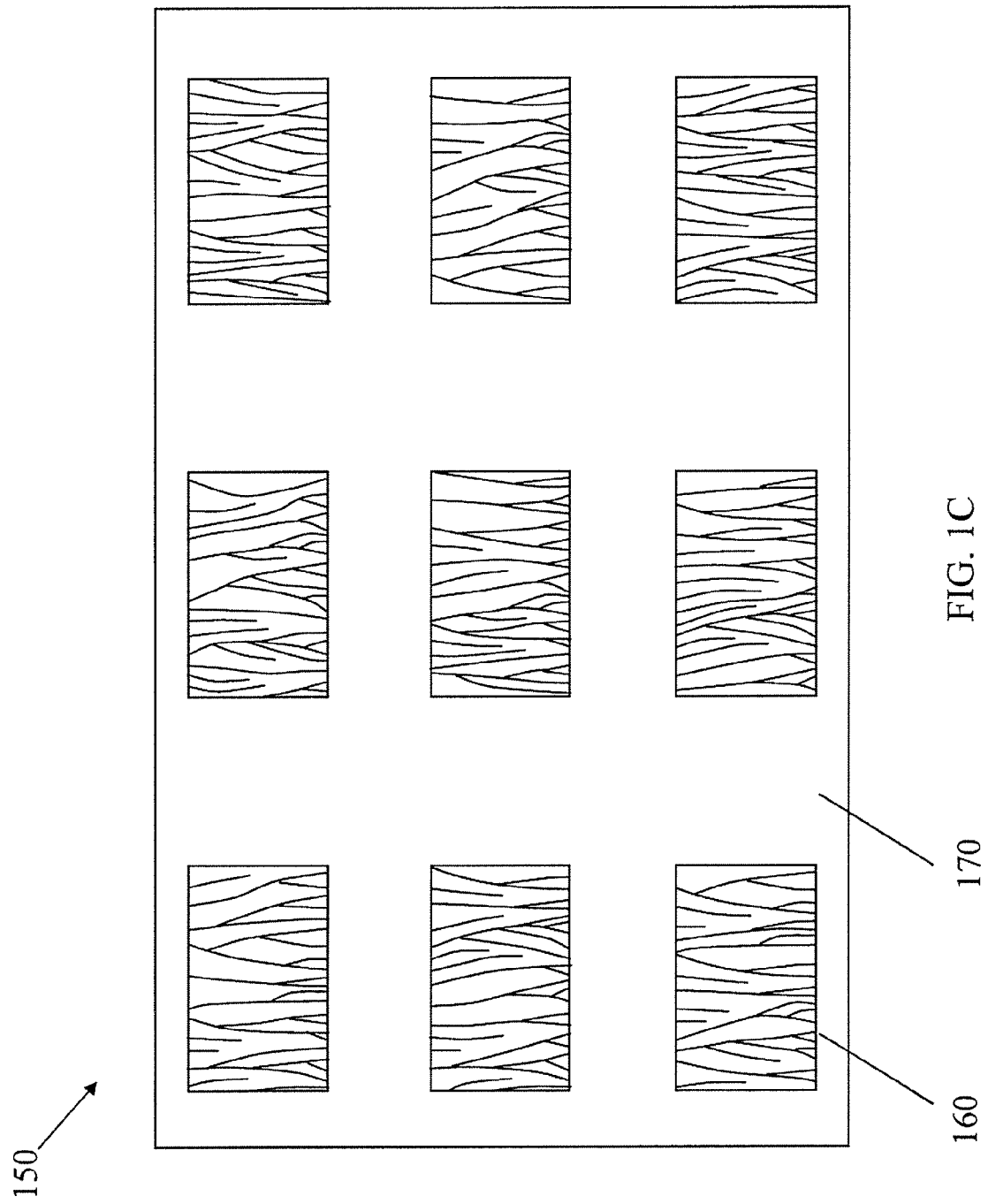
FIG. 1C is a schematic illustration of an array of laterally crystallized semiconductor islands, according to some embodiments.

FIG. 1C is a schematic illustration of an array 150 of laterally crystallized semiconductor islands, according to some embodiments. Array 150 contains multiple patterned islands 160. For example, as shown in FIG. 1C, each island can be shaped as a rectangle, similar to the pattern shown in FIG. 1A. The islands can also take other shapes according to other embodiments, some of which are described below. In some embodiments, these islands are originally formed out of silicon substrate before the substrate is irradiated with laser. The islands are separated by the areas 170, which can be made of a material that differs from that of the silicon islands, e.g. air, another gas, plastic or other material. The material used for area 170 may abut or contact island 160, so long as it does not alter the independent crystallization of the islands. It may be desirable to include a thermally insulating material, in or underneath area 170, to protect the underlying area from thermal damage.

As the laser beam scans a large area or even the entire surface, it will cover one or more of the islands. Each island melts and crystallizes independently from the rest of the islands. In the array of FIG. 1C, unlike the grid of FIG. 11, the islands are not connected to each other, and thus the number and characteristics of grains and grain boundaries in neighboring islands or closely located islands are not correlated. Each island can be used to create one TFT or a portion of a TFT as described in greater detail below, and the defects will be uniformly and randomly distributed among the TFTs. Thus on the average the performance will be uniform across the substrate. While in FIG. 1C the islands in array 150 appear to show the same microstructure, in arrays formed by the above process, the microstructures of the different islands will be independent and differ at least slightly from one another, although on average the islands will tend to have approximately comparable numbers and types of grain boundaries.

In some other embodiments, neighboring TFTs might share an island. These TFTs can be located side by side in a direction perpendicular to the direction of laser scan. In some other embodiments, the neighboring TFTs can be located at the same distance away from an edge of the island where directional crystallization is reinitiated. Thus the TFTs located with respect to each other along the direction of the laser scan do not share an island and remain uncorrelated. The TFTs neighboring each other along the perpendicular direction are also uncorrelated because the crystalline grains located in their channel region grow from different seeds.

Figure 1D:
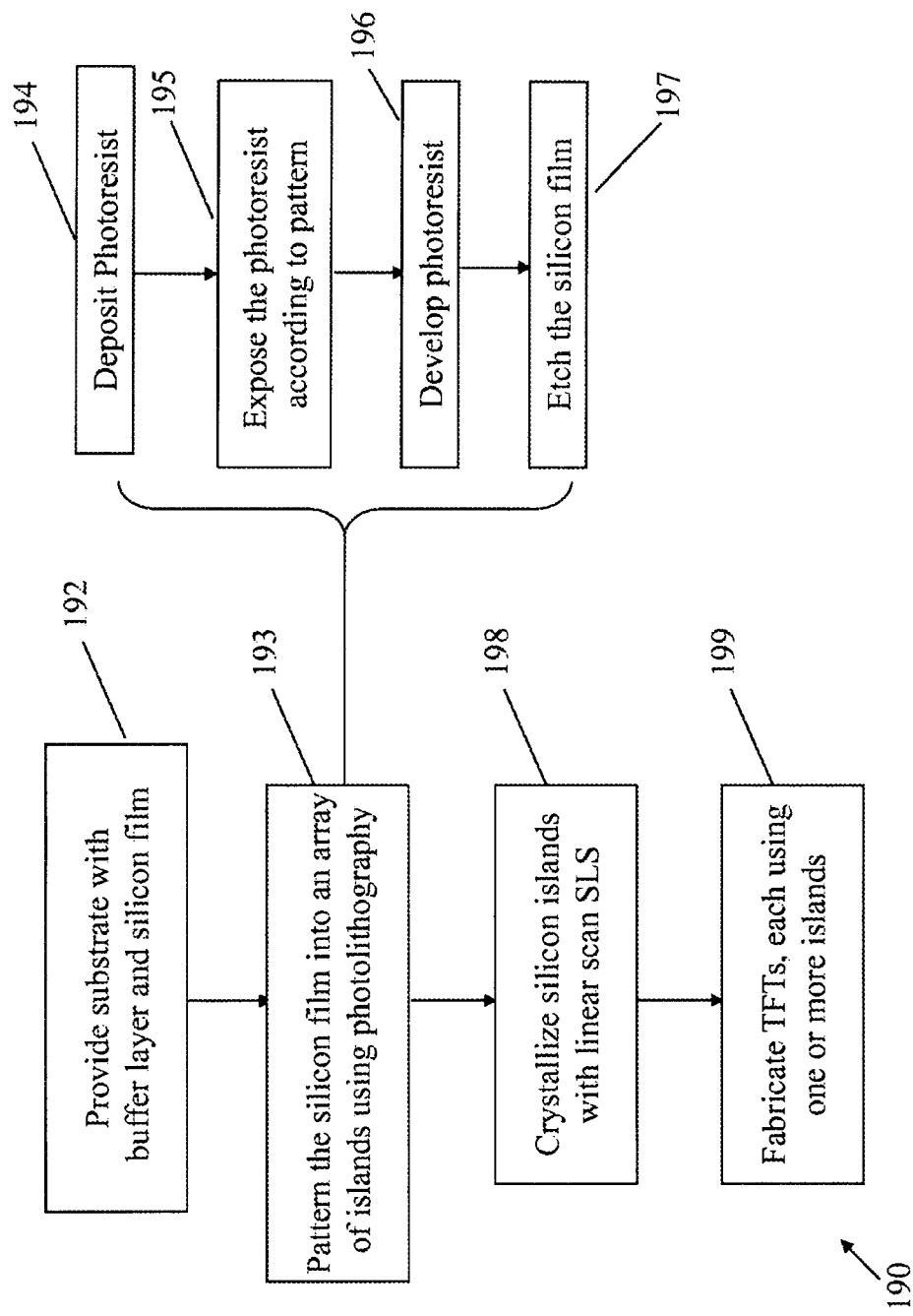
FIG. 1D is a chart of a method for fabricating TFT devices using laterally crystallized semiconductor patterned islands, according to some embodiments.

FIG. 1D is a chart 190 of a method for fabricating TFT devices using laterally crystallized semiconductor patterned islands, according to some embodiments. At 192 the substrate is prepared with buffer and silicon layers, using techniques known to those of skill in the art. At 193 the silicon layer is patterned into an array of islands, e.g., by using conventional photolithography techniques. For example, in some embodiments, at 194 a photoresist material can be deposited on the film surface, and subsequently at 195 exposed to a light pattern consistent with the desired pattern of the array. At 196, the exposed photoresist can be developed to leave photoresist "islands" according to the desired pattern, and at 197 the silicon outside the photoresist islands is etched away. In other embodiments, at 193 other techniques, such as silk screening, ink-jet printing or imprint techniques, can be used for patterning the silicon layer into the array of islands. In different embodiments the islands are arranged in different patterns. For example, in some embodiments the desired pattern is a set of islands according to the pattern shown in FIG. 1C. Also the technique of patterning the silicon film can be any other standard technique appropriate for rendering the silicon film into the desired pattern.

Once the silicon layer is patterned, the islands are crystallized at 198, e.g., by scanning the whole substrate or a sub-region spanning one or more islands using the SLS method. Such a scan can result in crystallization of the patterned region covered with silicon. In some embodiments, the SLS is designed such that the laser beam covers the whole width of the substrate and thus crystallizes all islands in one scan. In other embodiments, the laser beam can cover and crystallize the islands through more than one scan across the substrate. The length of the laser beam may cover one or more island or even all islands along one cross section of the substrate. In some embodiments, the characteristics of the laser beam and its motion can be chosen as that needed for directional SLS. In other embodiments, they can be chosen as that of "2 shot" SLS.

At 199, the TFTs are fabricated using one or more crystallized islands, such that no two TFTs share the same island. In some embodiments, no further patterning of the silicon is required at this stage. Thus, the total number of lithographic steps can be essentially the same as conventional processes which require patterning the film after its crystallization. In some embodiments, the TFTs are formed by depositing and forming the gate dielectric and metalline contact in the gate area, and then doping the TFT areas, for example as a p-doped region. The presence of the gate substantially masks the gate area from being doped and thus only the source and drain areas will be doped, while the gate area will remain substantially undoped or lightly doped. Finally, the source and drain contacts are formed on their corresponding areas.

In some embodiments, the film is patterned using methods other than a lithographical method which requires one patterning step before crystallization and one after crystallization. Less expensive patterning procedures can be applied in the first step in order to create a "blanket" array of silicon lines. In these embodiments, the patterned lines may not be as accurately placed at the start. Still the line width and spacing is uniform and every device, whose width is a multiple of the line pitch (line width plus the distance between lines, i.e, the space periodicity of the lines), will include the same number of lines. In these embodiments, after crystallization, the lines may be patterned to remove any Si outside of the device areas.

In some embodiments, printing techniques are used to print long lines of a masking material (e.g., wax based material). Consequently, the unmasked parts of the film are removed by etching. In other embodiments, silicon is directly printed, for example by using silicon nano-particle solutions or special inks. In some other embodiments, interference based patterning techniques are used to create the patterns. In these embodiments, two coherent beams interfere and create an array of lines. In yet, some other embodiments, soft lithography techniques are used, e.g., by stamping the arrays into a soft layer after which the parts of silicon film under the depressed regions are removed by etching.

Figure 2A:
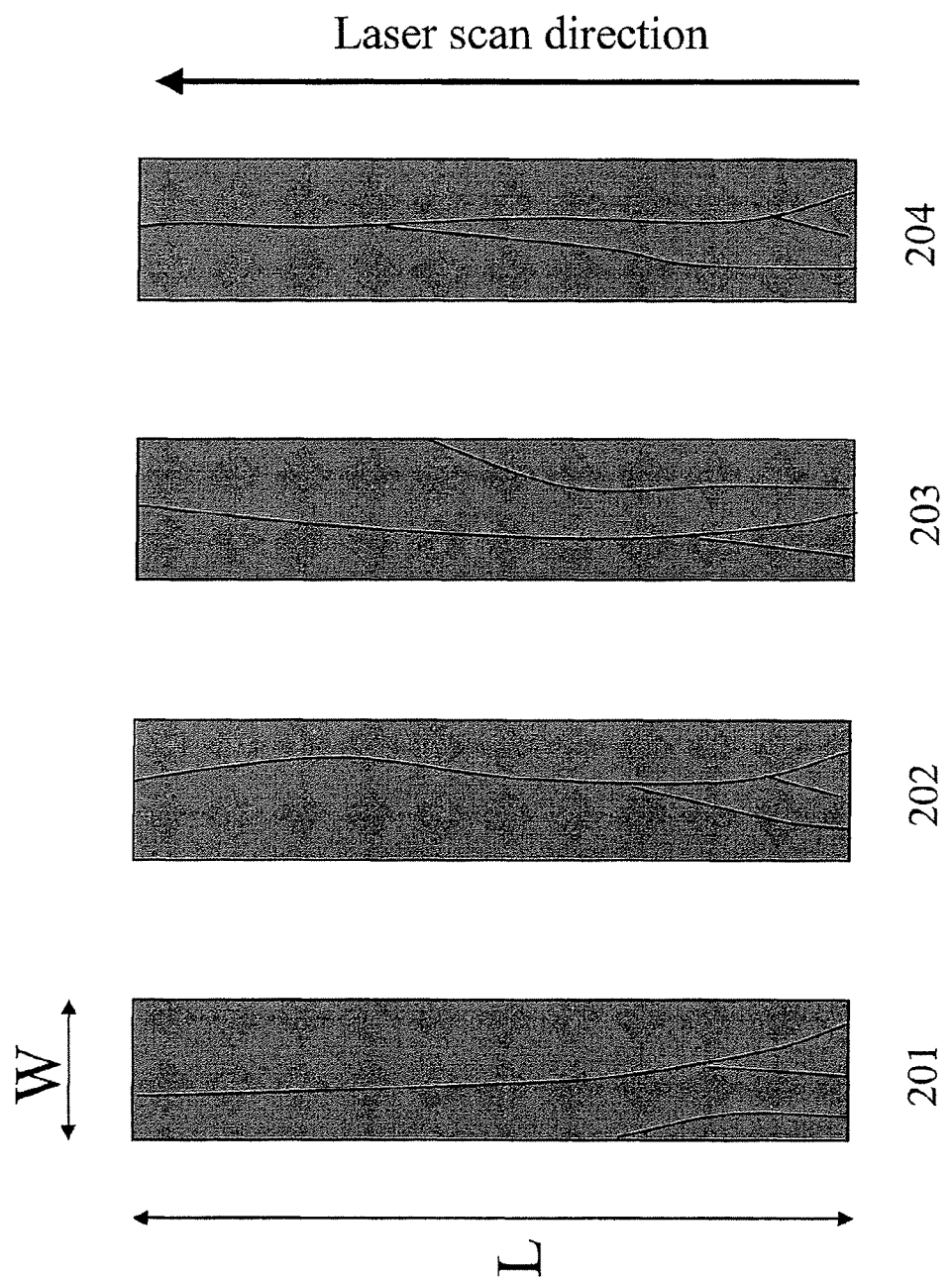
FIG. 2A shows a "stripe" patterned silicon island according to some embodiments.

FIGS. 2A-2F show alternative island patterns that can be used according to some embodiments. FIG. 2A shows a "stripe" patterned silicon island. The TFT spans a plurality of stripes 201-204. Each stripe has a width W that is a fraction of the width of the TFT channel, and a length L that is sufficient to make a device active area from source to drain. The widths of metagrains, as shown in the FIG. 2A, are limited to that of the stripe-shaped islands. Often, as a result of heat flow considerations, the island can actually contain two metagrains that grow with a slightly inward deviation from the direction of the scan. Striped patterns can confine metagrains or grains within one stripe form. In some embodiments, there will be two grains physically confined within one stripe. The performance of a TFT built using several stripes is based on the average properties of those stripes, each of which typically contains two metagrains that each have different defect densities and orientations.

Figure 2B:
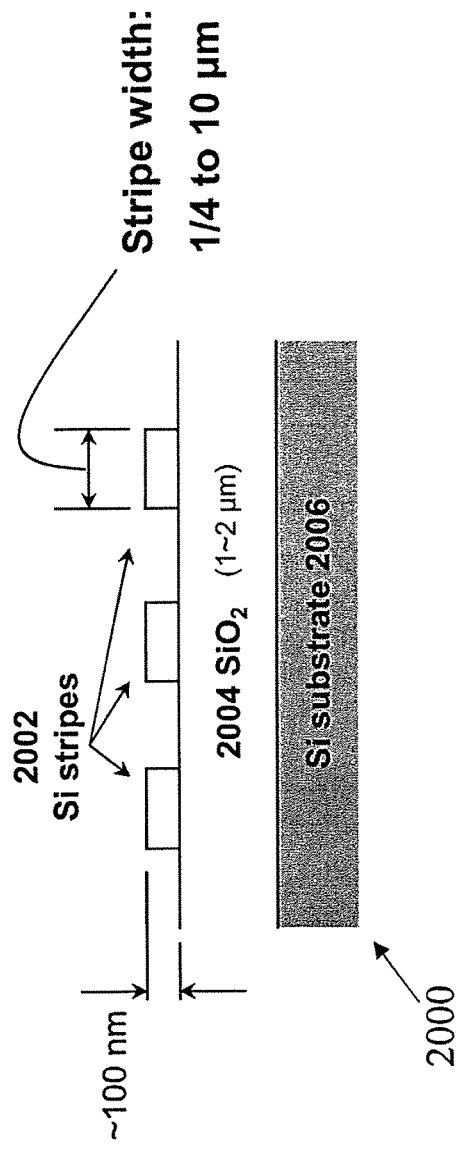
FIG. 2B shows a cross section of a system using a striped patterned silicon layer, in accordance with an embodiment.

FIG. 2B shows a cross section of a system 2000, using a striped patterned silicon layer, in accordance with an embodiment. System 2000 contains silicon stripes 2002, formed over a layer 2004, made, for example, of silica or another intert material. Layer 2004 is formed over a substrate 2006, made, for example, of glass or silicon. The stripes 2002 have a width typically in the range 0.25 to 10 μm, and a thickness typically below 1 μm, for example, a few hundreds of nanometers. The silica layer 2004 has a thickness typically up to around a few microns, for example, between 100 nm to 2 μm.

Figure 2D:
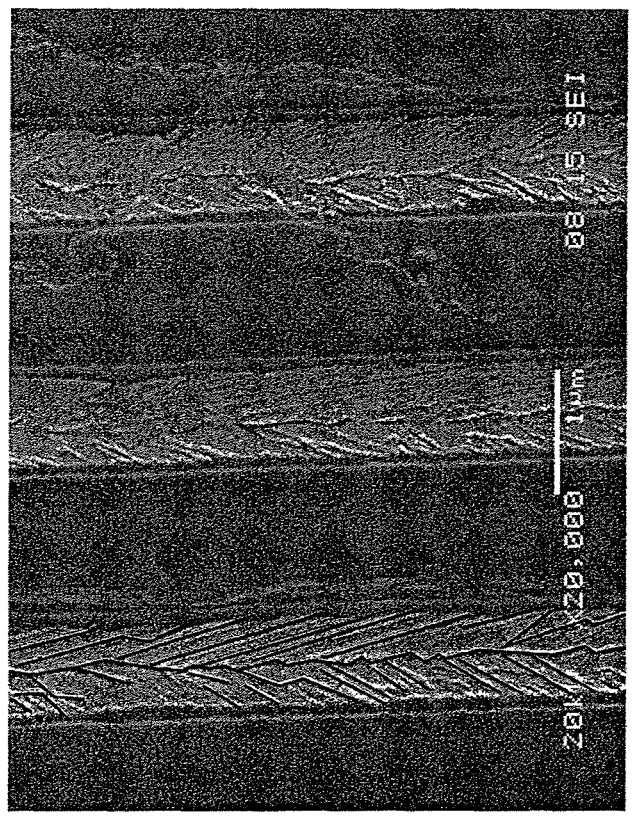
FIGS. 2C-2D, show SEM images of crystallized silicon stripes according to some embodiments.
Figure 2C:
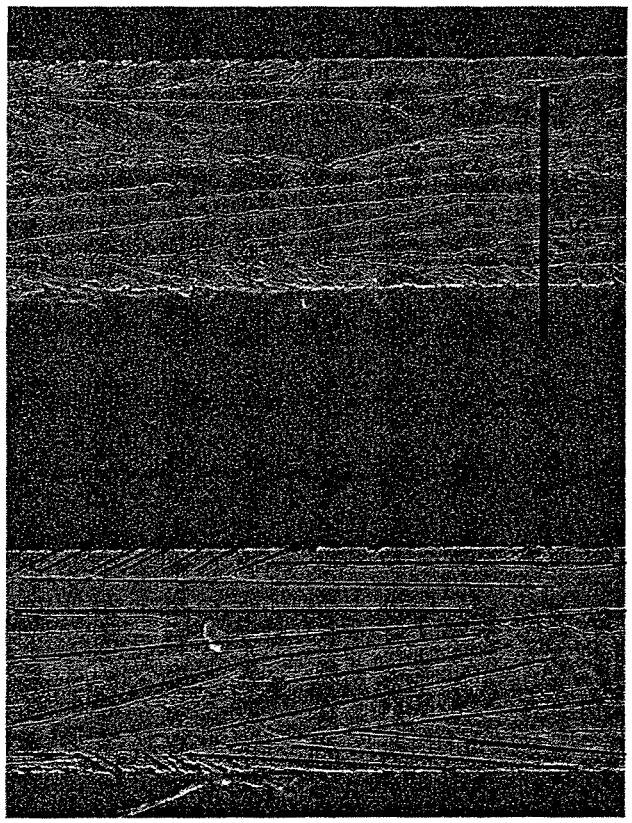

FIGS. 2C-2D, show SEM images of crystallized silicon stripes according to some embodiments. The width of the stripes is around 5 μm in FIG. 2C and around 1 μm in FIG. 2D. Both figures show perpendicular grain boundaries, extending from top to bottom, and horizontal grain boundaries extending from sides towards the center and intersecting the perpendicular grain boundaries. Note that for some stripes, grain boundaries have been artificially enhanced in the picture for the purpose of illustration.

Figure 2E:
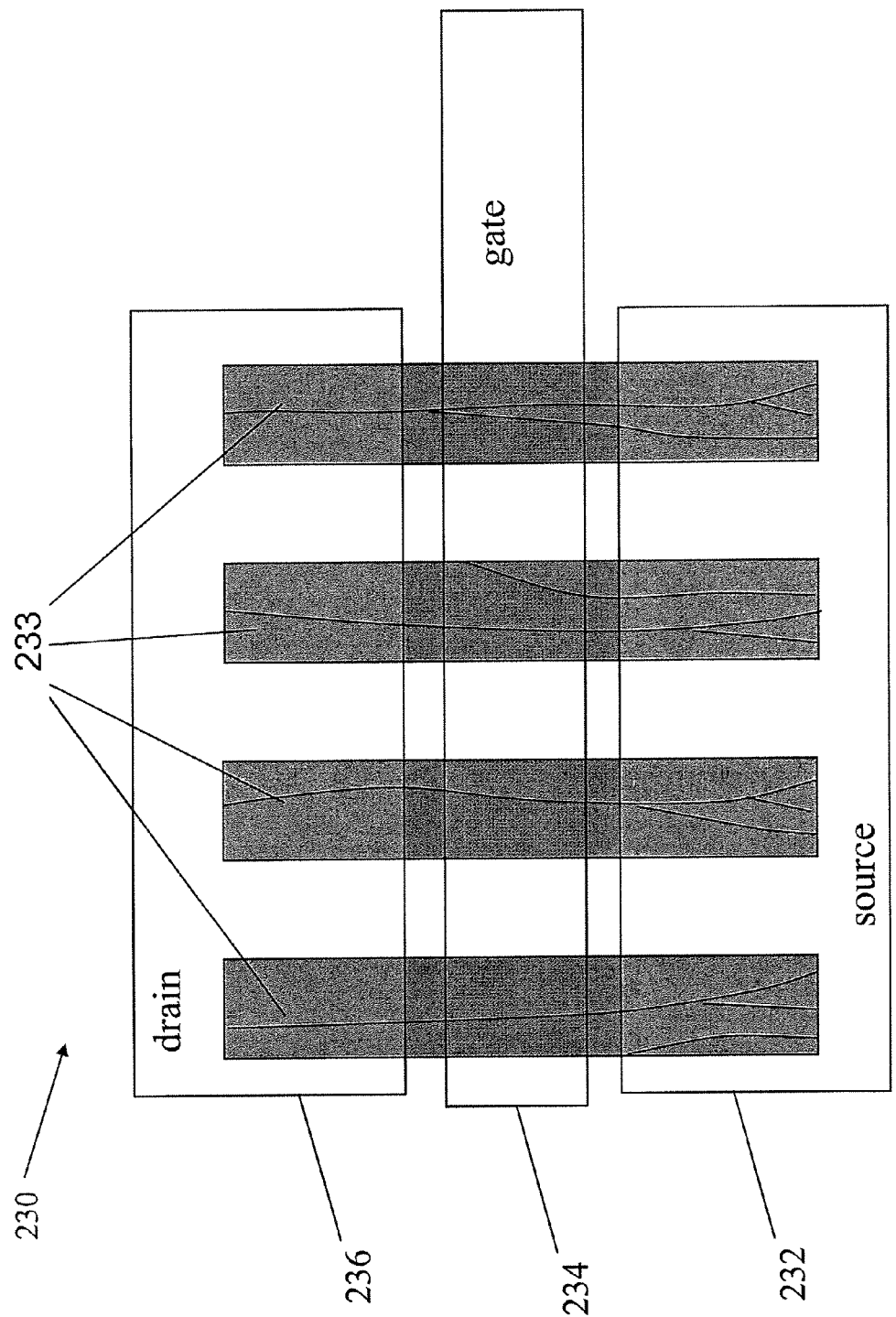
FIG. 2E shows one TFT formed using striped patterns, according to some embodiments.

FIG. 2E shows one TFT 230 formed using striped patterns, according to some embodiments. The source metal 232, gate metal 234, and drain metal 236 are formed such that they overlay at least a portion of all stripes 233 contained in the TFT.

In some embodiments, stripe patterned islands are formed at nanometer scales, that is with widths that are few to tens of nanometers. For nano-scale stripes, each device can contain a larger number of stripes and thus properties of the device average better and with less fluctuations. Striped patterned islands can be created using different methods. In some embodiments the stripes are created by applying lithographical processes to the silicon film. In some embodiments, nano-scale lithography is used to create nano-scale stripes (also known as nano-wires). In some other embodiments, nano-wires are created using known methods that utilize polymers that self-align into nanostructures. These silicon nano-wires are subsequently crystallized, for example, using directional SLS.

Figure 2F:
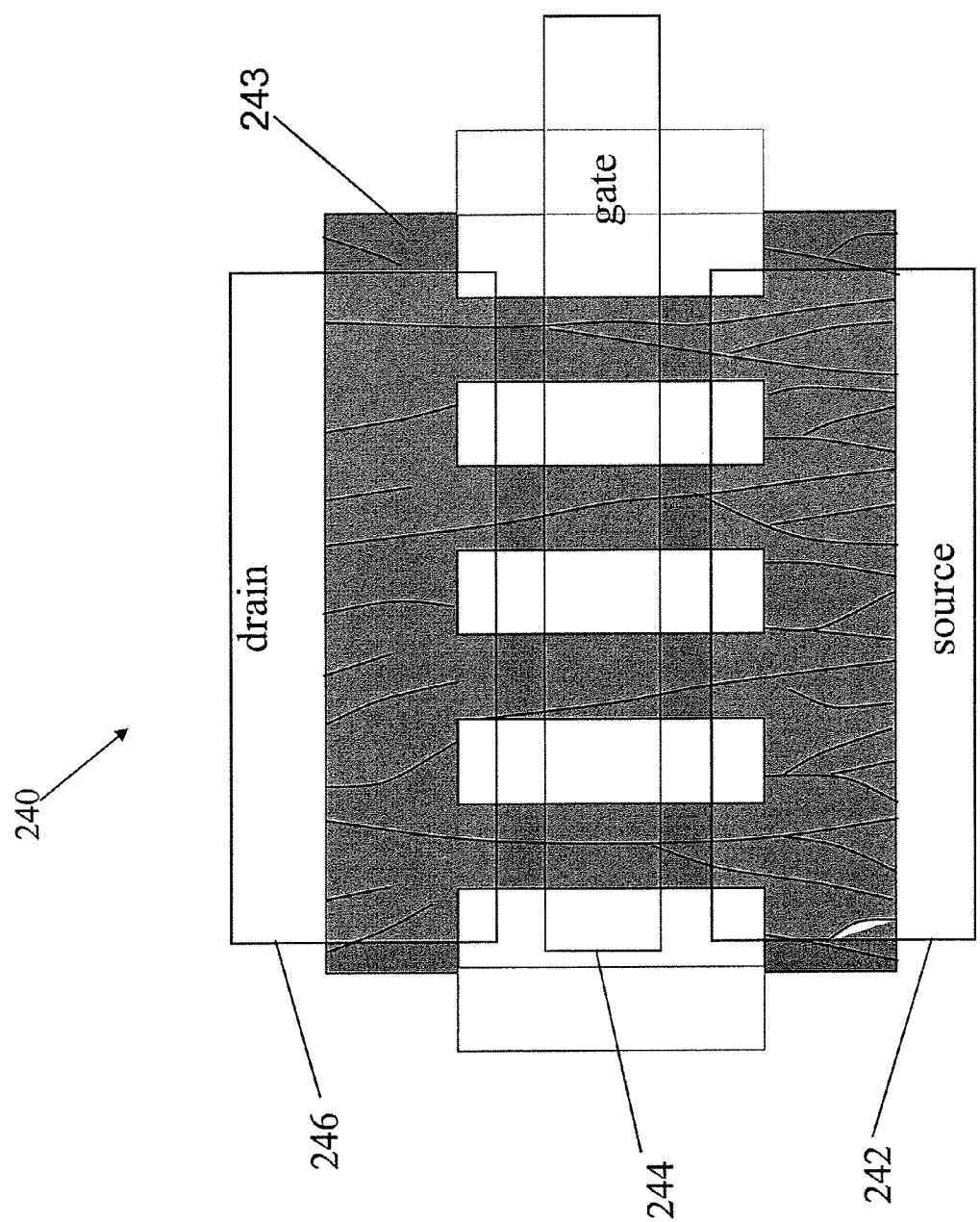
FIG. 2F shows a schematic illustration of a TFT device fabricated using a laterally crystallized semiconductor island having "stripes" in the channel region and enlarged source and drain regions for contacting source and drain contacts, according to some embodiments.

FIG. 2F shows another striped pattern that can be used for forming one TFT according to some embodiments. In this pattern striped islands connect to each other at their ends and form the crystallized region 243. The location of the source metal 242, gate metal 244 and drain metal 246 are shown. Compared with the embodiment in FIG. 2E, this embodiment provides a larger contact area between the source and drain metal and the silicon film, while still limiting the formation of metagrains in the channel region.

In some embodiments, striped patterns contain nano-scale stripes (nano-wires). In these embodiments, known methods are used to create islands of nano-wires (see e.g., C. T. Black, Applied Physics Letters, 87, 163116 (2005); Sang-Min Park, et. al, Advanced Materials, 2007, 19, 607-611). The nanowire islands are subsequently crystallized and used for building TFTs.

Figures 3A, 3B, 3C:
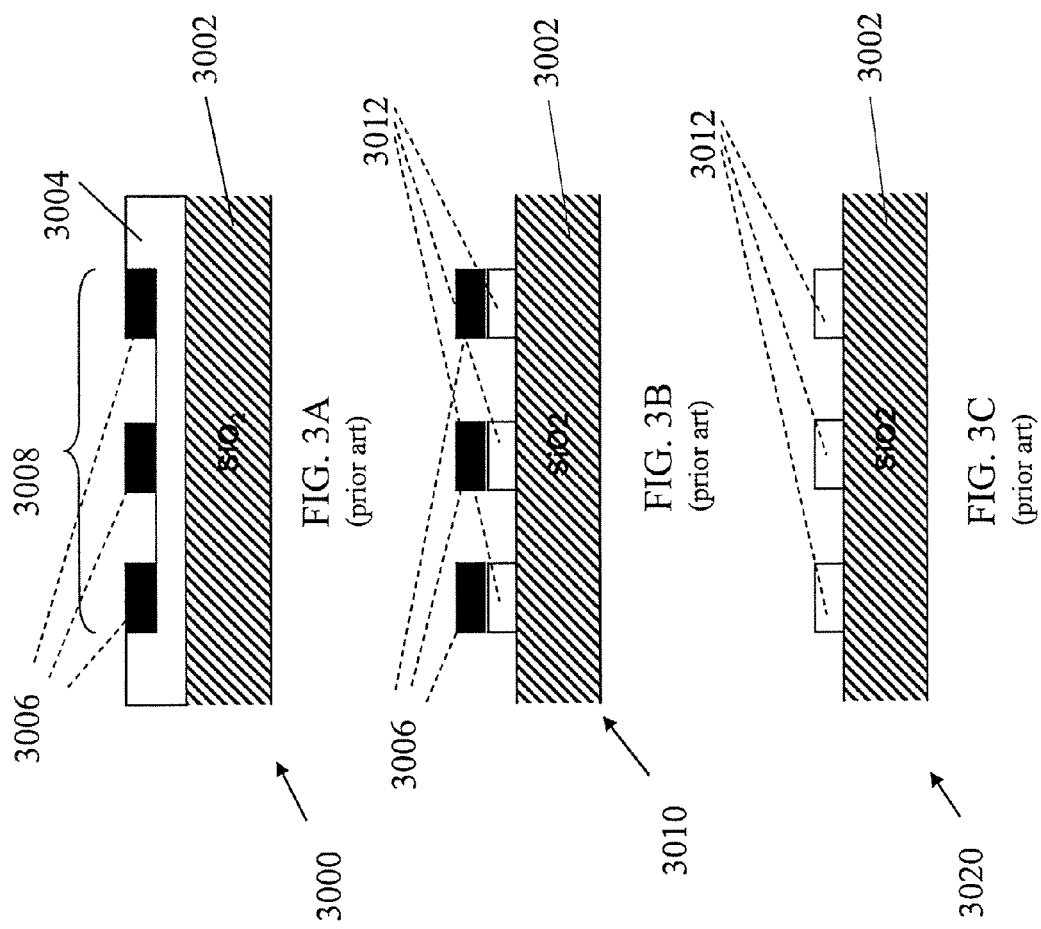
FIGS. 3A-3C depict a method, using known processes for creating polymer nano-wires and silicon nano-wire islands, utilized in manufacturing TFTs on striped islands.

FIGS. 3A-3C depict one such method, using polymer nano-wires to create silicon nano-wire islands, utilized in manufacturing TFTs. FIG. 3A shows a schematic cross section of a system 3000 composed of a set of polymer nanowires 3006, formed over a silicon layer 3004 covering a substrate 3002. The substrate 3002 can, for example, be made of Si—O2, or glass, or silicon, or plastic with an appropriate thermal buffer layer on top.

This method, as, for instance, described in the references above, first creates a trench 3008 in the silicon layer and then applies diblock copolymers which self align to form polymer nano-wires 3006 over the silicon layer.

The method subsequently uses an etching process to remove those parts of the silicon layer 3004 which are not masked by polymer nano-wires 3006. FIG. 3B shows a schematic cross section of a system 3010, thus formed. The system includes a layer of silicon nano-wires 3012 formed underneath the polymer nano-wires 3006.

The method next removes the polymer nano-wires 3006. FIG. 3C depicts a schematic cross section of a system 3020 thus formed. System 3020 contains a set of nano-wires 3012, over the substrate 3002. One advantage of using polymer nano-wires to create silicon nano-wires is that polymer nanowire show very little variation in their width, since their dimension is dictated by the size of their constituent polymers. As a result, silicon nano-wire stripes can be built with precisely defined widths.

Silicon nano-wire islands can be crystallized using directional SLS and utilized in building devices as explained earlier. Crystallized silicon nano-wires are for example useful in creating smaller precision devices, like those used in 3D IC. Moreover, due to their large surface to volume ratios, nanowires can require significantly lower, e.g., less than half, beam energy densities to melt, and thus can reduce the risk of damages to the substrate. This lower energy density is specifically important for substrates that can not tolerate high energy densities. The lower required energy density also can increase the throughput of a crystallization process. The lower energy density enables the technique to spread the laser energy over a larger area or the use of a larger pulse rate for the laser beam and thus enables covering a larger area of the film within the same time interval.

Figure 4:
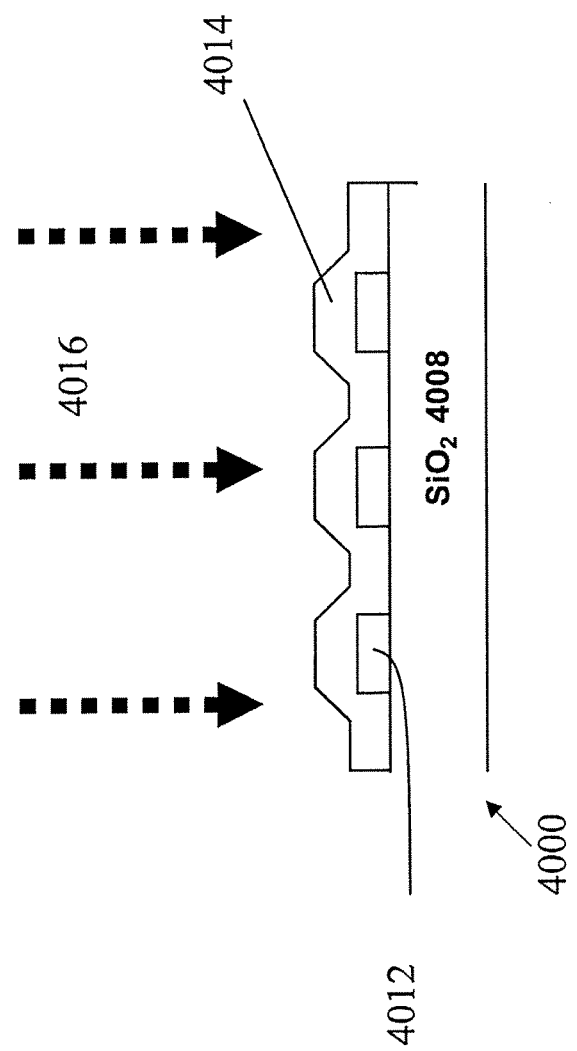
FIG. 4 depicts a cross section of a system using a capping layer, in accordance with some embodiments.

In some embodiments, prior to crystallization, the striped patterned silicon film is covered by a capping layer. FIG. 4 depicts a cross section of a system 4000, using a capping layer, in accordance with some embodiments. The system 4000 includes a set of silicon stripes 4012 on a silica substrate 4008. The stripes are further covered by a capping layer 4014, for example, made of silica. The system is then irradiated via laser beam 4016. The capping layer, 4014, can prevent stripes 4012 from agglomeration upon melting and help them preserve their uniform size. Such capping layer may specifically be useful for narrower stripes, e.g., silicon nano-wires.

Under some circumstances, if the laser light beam irradiates the sample outside of the islands, it can damage the substrate underneath, or, if the substrate is partially transparent, it can even damage what is located below the substrate, e.g. on the sample vacuum chuck. To avoid such damage, in some embodiments, the rest of the substrate outside the islands is covered with a protective material, such as silicon or other thermally shielding material, but in a way that each island remains disconnected from the rest of the Si film by gaps.

Figure 5A:
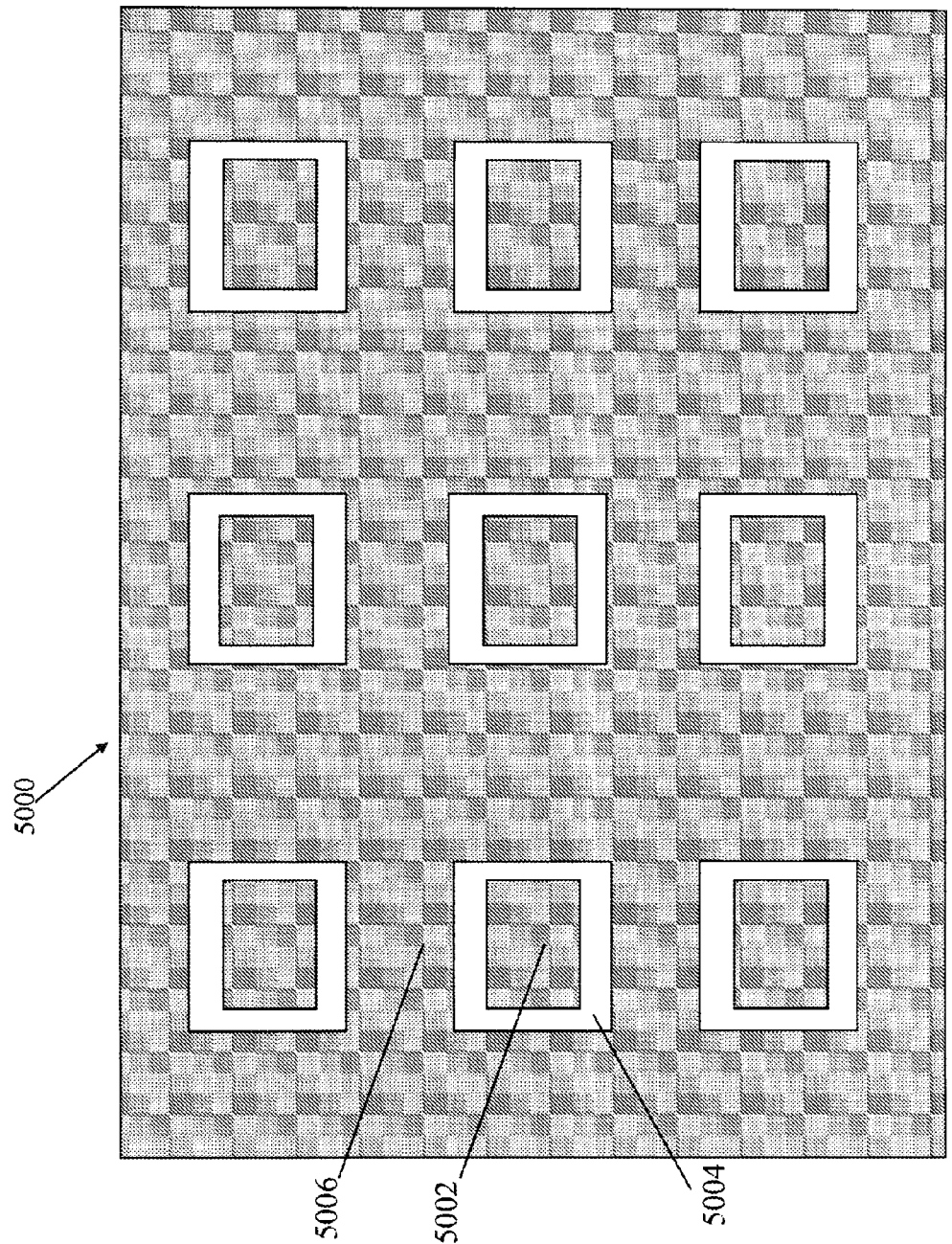
FIGS. 5A-5B are schematic illustrations of arrays of laterally crystallized semiconductor islands separated by gaps from a surrounding thin semiconductor films, according to some embodiments.

FIG. 5A is a schematic illustration of such an array of laterally crystallized semiconductor islands separated by gaps from a surrounding thin semiconductor film, according to some embodiments. The pattern of array 5000 shown in FIG. 5A is similar to the rectangular island array of FIG. 1C, but the same concept can be applied to any other pattern and array. So in FIG. 5A, each island 5002 can represent the rectangular region 160 of FIG. 1C. Alternatively, island 5002, can represent the stripe set of island 233 in FIG. 2E or the crystallized region 243 in FIG. 2F. Each island is formed disconnected by gaps 5004 from the rest of the surrounding film 5006. For such a substrate, as the laser beam scans a large area or even the entire surface, it covers one or more of the islands. Each island melts and crystallizes substantially independently from the rest of the substrate. At the same time the rest of the film outside the islands substantially prevents the laser beam from the substrate underneath the film.

Figure 5B:
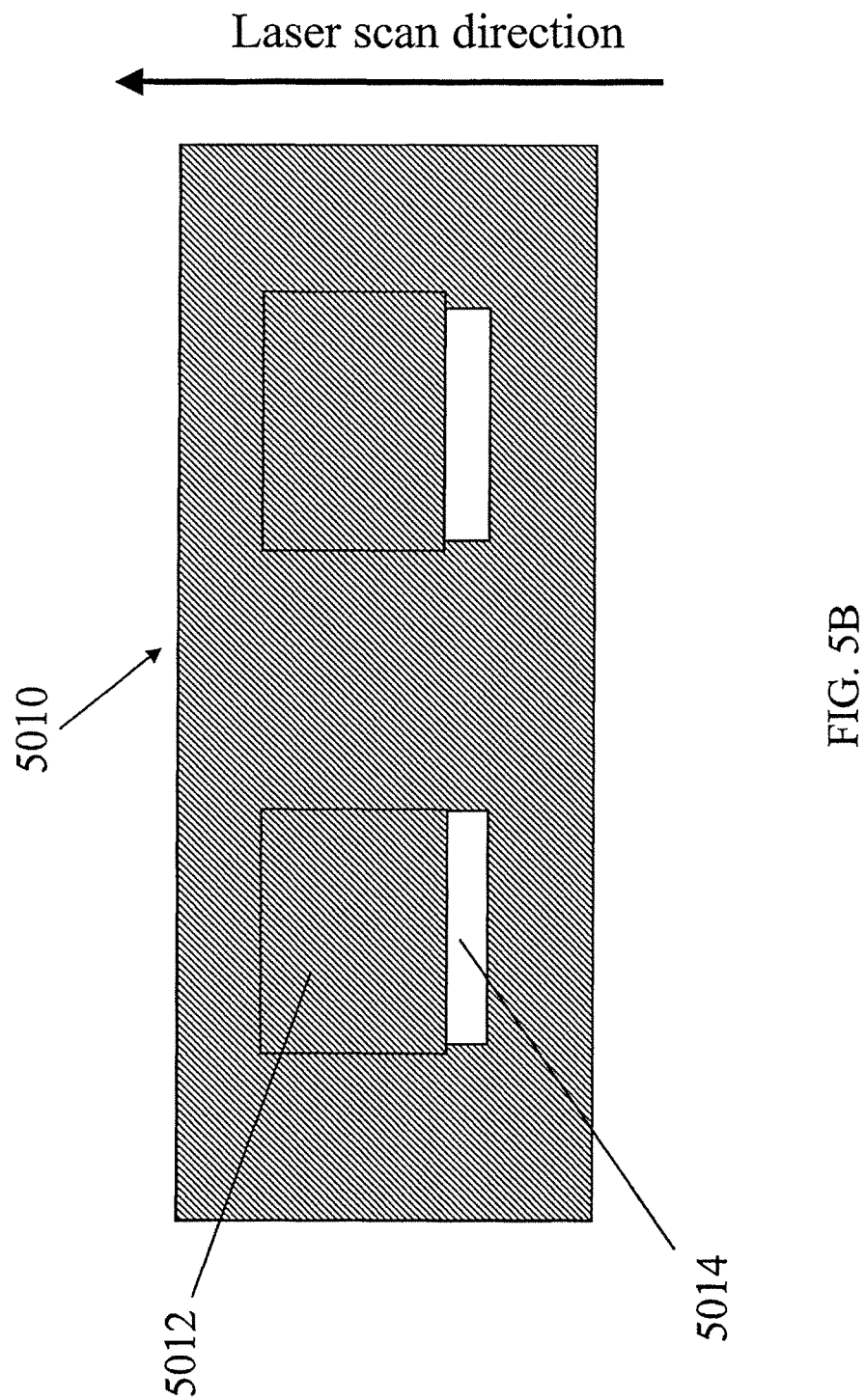

In some other embodiments, in place of creating disconnected islands, before crystallization, an etching mechanism is used remove some areas of the film outside the location of the islands, such that the crystallization in each island starts anew. FIG. 5B depicts a section of film 5010, etched in preparation for one such mechanism, in accordance with one embodiment. In FIG. 5B, the direction of laser beam scan is from bottom to top. Each silicon island 5012 is thus isolated from the island below it, by the gap 5014 that is etched away from the film before the laser beam is applied to the film. Thus, the crystallization in each island 5012 starts anew and is not correlated to the crystallization growth of the neighboring island below it. For some other embodiments, after crystallization is complete, another lithographic procedure is performed to remove the excess silicon outside TFT channel regions, in order to create transparent regions for the device, e.g., the LCD pixel regions.

Figure 6B:
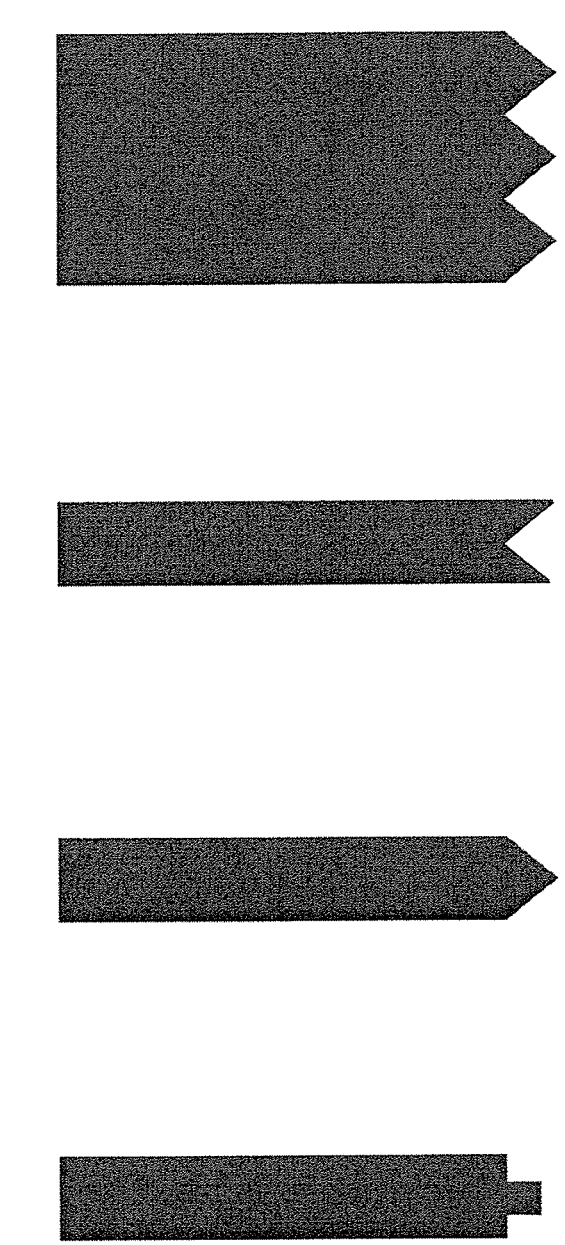
FIG. 6B is a schematic illustration of a variety of patterns of laterally crystallized semiconductor islands with different end shapes, according to some embodiments.

The grain structure of the islands or stripes may be further controlled by using islands or stripes in a variety of shapes. FIG. 6A shows a schematic illustration of a variety of shapes of laterally crystallized semiconductor islands, according to some embodiments. Stripe 6002 is a simple rectangular shaped island that can be used for one TFT or as part of a TFT in some embodiments. As mentioned, metagrains are confined within the island and subgrain boundaries can form in grains laterally growing on this island. Stripes 6004 and 6006 are other shapes of islands or parts of islands used in some embodiments. In these stripes, the overall orientation of the stripe is in the direction of the scan (for example from bottom to top), but the local orientation deviates from a straight line along the scan in such a way that the local orientation of metagrains changes during the scan and sub-grain boundaries terminate during growth, upon hitting the boundary of the stripe. This increases the randomness of defects within the island and the resultant uniformity of TFT performance containing these stripes. For example stripe 6004 shows a "zigzag" shaped island while stripe 6006 shows in a "curved" shaped island. In both embodiments, the source and drain contacts are located at the two ends, using one or multiple stripes as parts of one TFT.

As the detail of FIG. 1A shows, generally the grain width in an island is not uniform from beginning to end of the scan. The change in width can be, among other factors, a result of the occlusions of grains which occur when a grain boundary terminates after meeting another boundary. In FIG. 1A, two examples of occluded subgrains 108 are marked. The occlusion rate is relatively high at the beginning of the scan, and decreases as the scan proceeds. To create a more uniform grain width throughout the length of the island, patterns can be used that limit the number of starting grain seeds and thus reduce the number of occlusions.

Figure 7B:
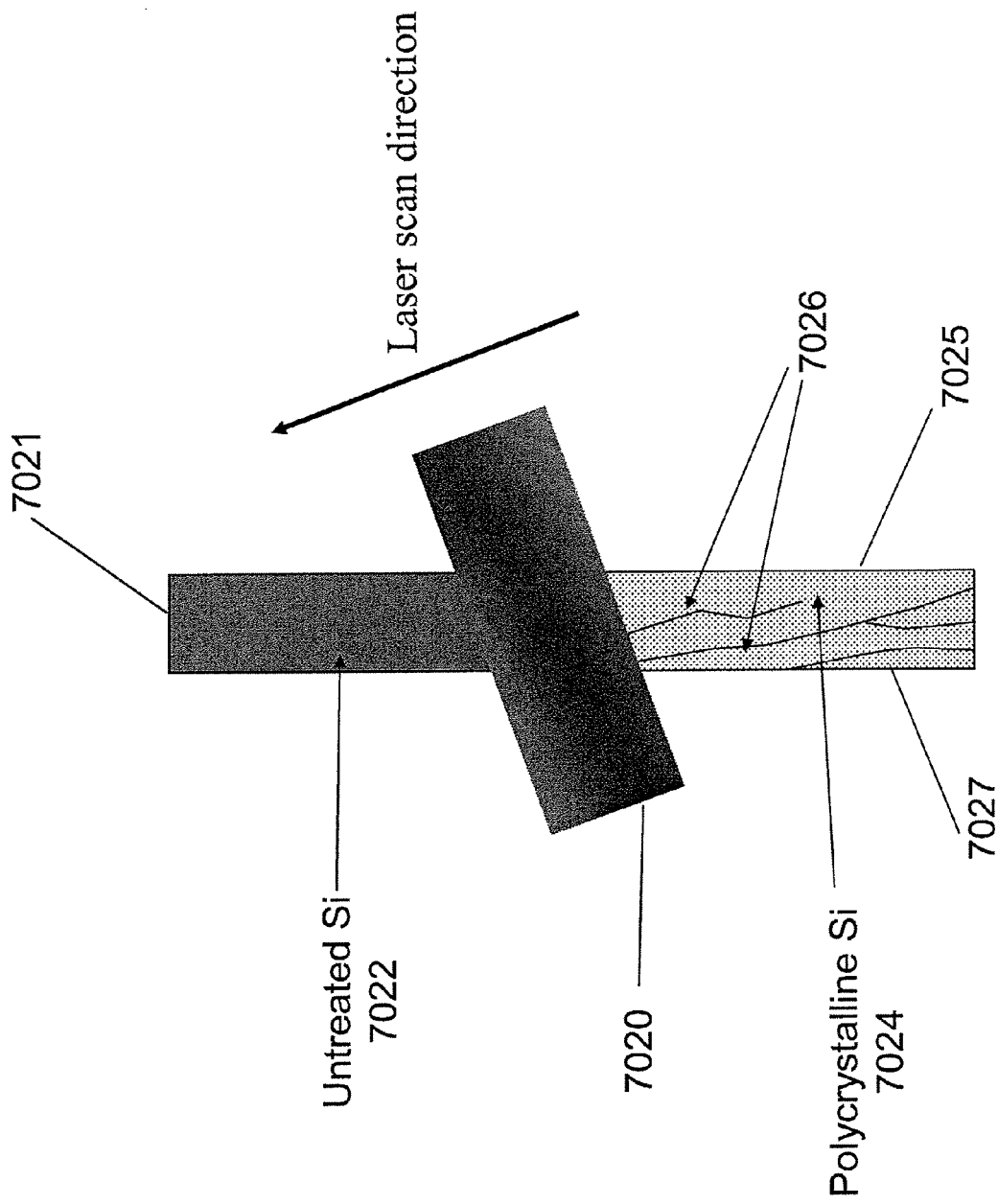
FIG. 7B is a schematic illustration of a tilted laser beam used to crystallize a semiconductor island according to some embodiments.

FIG. 7B is a schematic illustration of a variety of patterns of laterally crystallized semiconductor islands with different end shapes, according to some embodiments. These end shapes can limit the number of seeds for lateral growth by for example decreasing for each island the surface area hit at the beginning of the scan, and thus possibly limiting the number of seeds to one or a few. In all these examples the laser beam scans the surface from bottom to top and thus the melting and subsequent solidification for each island starts at the lower edge. In shapes 6012 and 6014, the lower end is narrowed in order to essentially accommodate formation of very few, and possibly only one grain seed. In shape 6016, the lower end has two pointed tips, to accommodate formation of possibly as few as two grain seeds. These two seeds will possibly initiate the growth of the two metagrains typically observed in one narrow island, as also seen in later stages of the growth of some stripes in FIG. 2A. For shape 6018 the number of tips is limited to three. Other kinds of shapes and tips can be used.

One can also make the characteristics of grains relatively random by tilting the line of scan with respect to the direction of the island. FIG. 7A is a schematic illustration of a non-tilted (perpendicularly oriented) laser beam used to crystallize a semiconductor island according to some embodiments. In FIG. 7A, the axis of the laser beam 7010 is perpendicular to the axis of the island 7001. As the laser scans the island from bottom to top, the untreated amorphous silicon 7002 melts and solidifies into the polycrystalline silicon 7004. The grain boundaries 7006 are formed more or less along the direction of scan, perpendicular to the line of the laser beam. In contrast, FIG. 7B illustrates a tilted laser beam used to crystallize a semiconductor island, according to some embodiments. In FIG. 7B, the laser beam 7020 is set up to be non-perpendicular with respect to the axis of the silicon island 7021. In the tilted scan of FIG. 7B grains and grain boundaries can generally start forming on one side, for example closer to the right edge 7025 of the island. As the scan progresses, once again grain boundaries 7026 grow more or less along the direction of scan, and perpendicular to the line of the laser beam. These boundaries will subsequently reach the left edge 7027 of the island and terminate. This process can result in grains with random orientations and defect densities within one patterned silicon because the grain characteristics are selected not by growth preference, which mainly cause (100) or (110)-RD metagrains, but just by the characteristics of grain that start growing at the one side of patterned Si, which tend to be more stochastic.

One approach to configuring and implementing SLS involves the use of a single line beam, which is scanned over the film at a constant scan velocity/laser frequency combination in accordance with SLS processing requirements. This particular scheme is referred to as "line-scan SLS". The use of high-repetition and high-power pulsed lasers, in particular, can potentially permit line-scan SLS to attain high effective crystallization rates, and thus can be well suited for high throughput production of TFT-based AMLCDs and AMOLED displays.

Figure 9A:
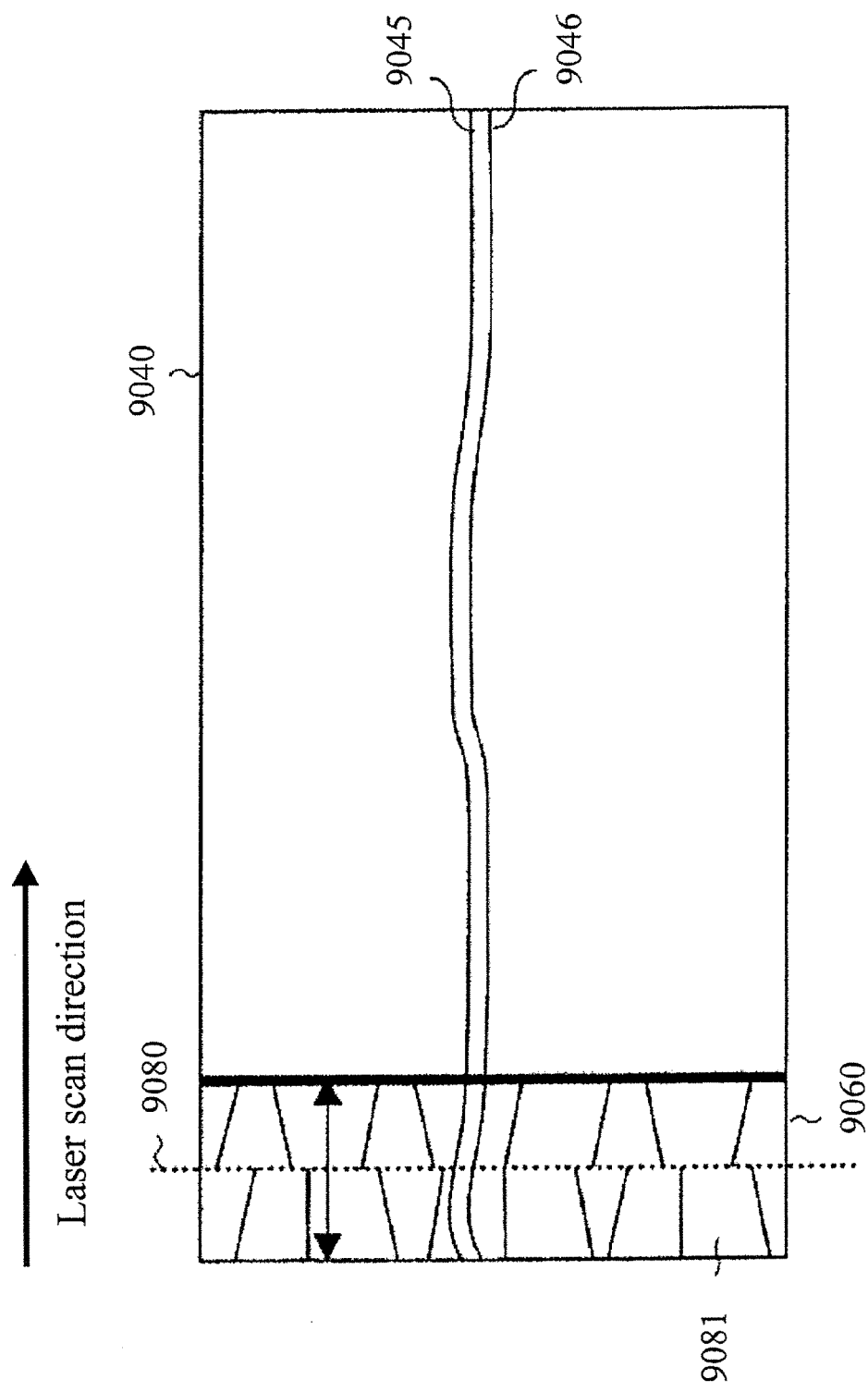
FIGS. 9A-9C illustrate the generation of "directional" crystals using sequential lateral solidification.

A method using "line beam" SLS for processing a thin film is described with reference to FIGS. 9A-9C. FIG. 9A shows a region 9040 of a semiconductor film, e.g., an amorphous silicon film prior to "directional" crystallization, and an irradiating laser pulse in rectangular region 9060. The laser pulse melts the film in region 9060. The width of the melted region is referred to as the molten zone width (MZW) marked by a double headed arrow. It should be noted that the laser irradiation region is not drawn to scale in FIG. 9A. In some embodiments, region 9040, can represent the area of on island in a patterned film, similar to that illustrated in FIG. 9A. In other embodiments, region 9040 can represent an area of the film containing multiple or even all of the islands in a patterned array. In some embodiments, the length of the region 9040 can be much greater than the width, as indicated by lines 9045, 9046. This allows for a very long region of the film to be irradiated, for example, which is as long or longer than the length of a display that can be produced from the film. In some embodiments, the length of the laser irradiation region substantially spans several devices or even the length or width of the substrate. Using an appropriate laser source and optics, it is possible to generate a laser beam that is 1000 mm long or even longer. In general, the width of the beam is sufficiently narrow that the fluence of laser irradiation is high enough to completely melt the irradiated region. In some embodiments, the width of the beam is sufficiently narrow to avoid nucleation in the crystals that subsequently grow in the melted region. The laser irradiation pattern, e.g., the image defined by the laser pulse, is spatially shaped using a mask, slit, or focusing optics, for example.

After laser irradiation, the melted film begins to crystallize at the solid boundaries of region 9060, and continues to crystallize inwards toward centerline 9080, forming crystals such as exemplary crystal 9081. The distance the crystals grow, which is also referred to as the characteristic lateral growth length ("characteristic LGL"), is a function of the film composition, film thickness, the substrate temperature, the laser pulse characteristics, the buffer layer material, if any, and the mask configuration, among other things, and can be defined as the LGL that occurs when growth is limited only by the occurrence of nucleation of solids in the supercooled liquid. For example, a typical characteristic LGL for a 50 nm thick silicon film is approximately 1-5 µm, e.g., about 2.5 µm. When growth is limited by other laterally growing fronts, as is the case here, where two fronts approach centerline 9080, the actual LGL can be less than the characteristic LGL. In that case, the LGL is typically approximately one half the width of the molten zone.

After the region 9060 is irradiated and subsequently laterally crystallized, the silicon film can be advanced in the direction of crystal growth by a distance that is less than the LGL, e.g., not more than 90% of the LGL. A subsequent laser pulse is then directed at a new area of the silicon film. For the fabrication of "directional" crystals, e.g., crystals having significant extension along a specific axis, the subsequent pulse substantially overlaps with an area that has already been crystallized. By advancing the film by a small distance, the crystals produced by earlier pulses act as seed crystals for subsequent crystallization of adjacent material. By repeating the process of advancing the film by small steps, and irradiating the film with a laser pulse at least step, crystals are made to grow laterally across the film, in the direction of the movement of the film relative to the laser pulse.

Figure 9B:
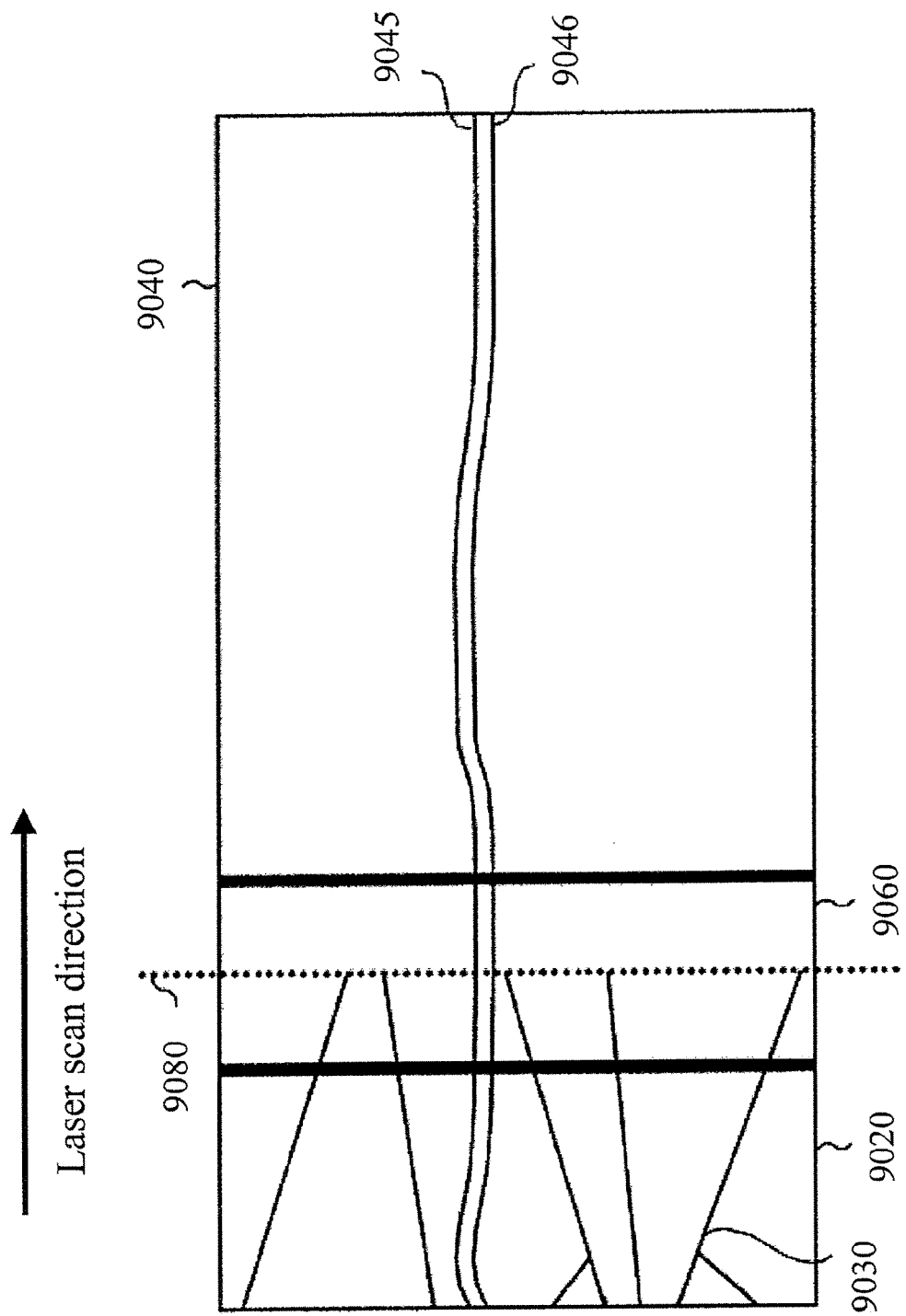

FIG. 9B shows the region 9040 of the film after several iterations of moving the film and irradiating with laser pulses. As is shown, an area 9020 that has been irradiated by several pulses has formed elongated crystals that have grown in a direction substantially perpendicular to the length of the irradiation pattern. Substantially perpendicular means that a majority of lines faulted by crystal boundaries 9030 could be extended to intersect with dashed centerline 9080.

Figure 9C:
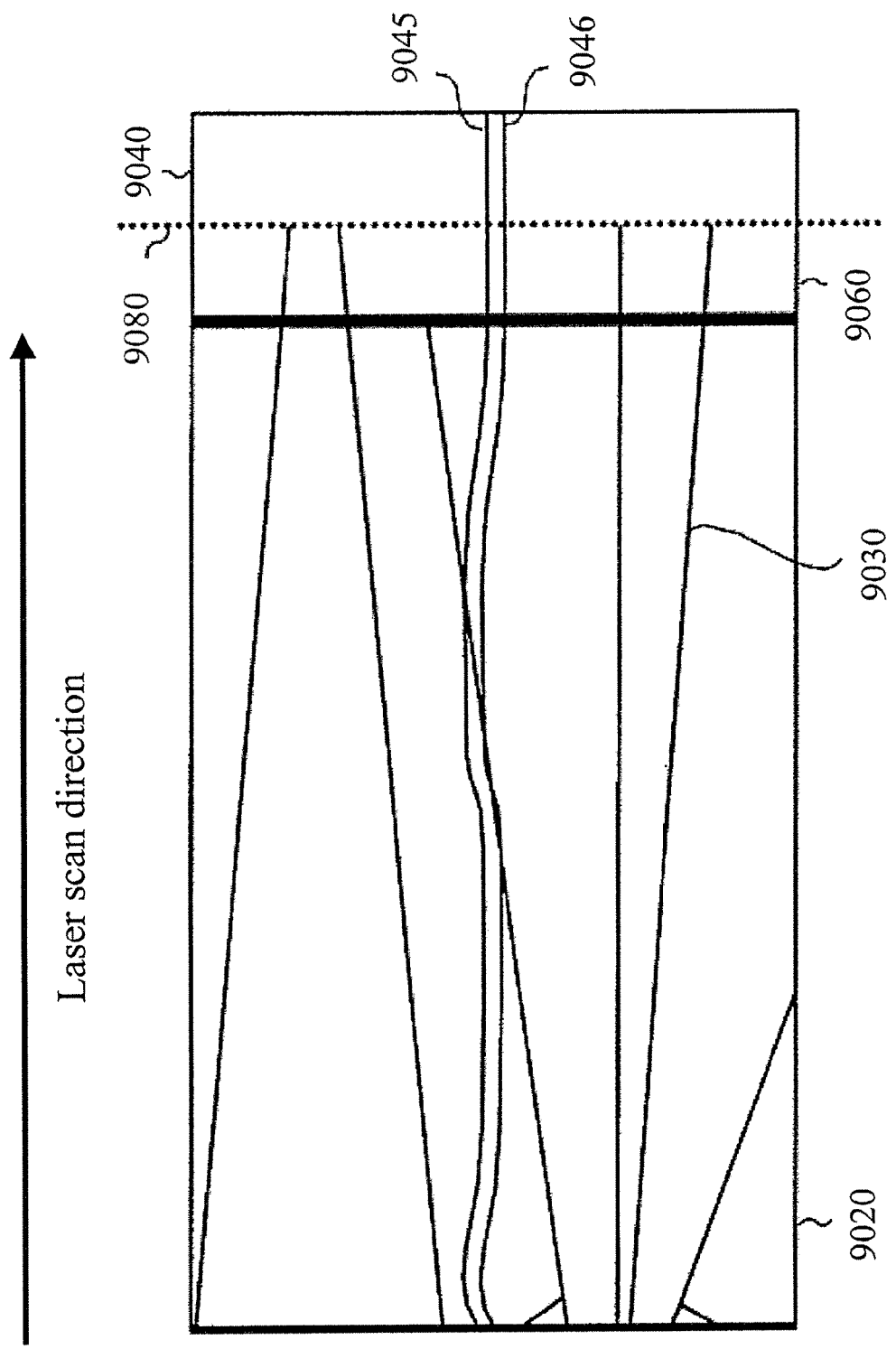

FIG. 9C shows the region 9040 of film after crystallization is almost complete. The crystals have continued to grow in the direction of the movement of the film relative to the irradiation region thereby forming a polycrystalline region. The film continues to advance relative to irradiated regions, e.g., region 9060, by substantially equal distances. Iterations of moving and irradiating the film are continued until the irradiated area reaches the edge of a region of the film. By using a number of laser pulses to irradiate a region, i.e., a small translation distance of the film between laser pulses, a film having highly elongated grains can be produced. Such a grain structure is referred to as "directional" because the grains are oriented in a clearly discernable direction. For further details, see U.S. Pat. No. 6,322,625, the entire contents of which are incorporated by reference.

Figure 10:
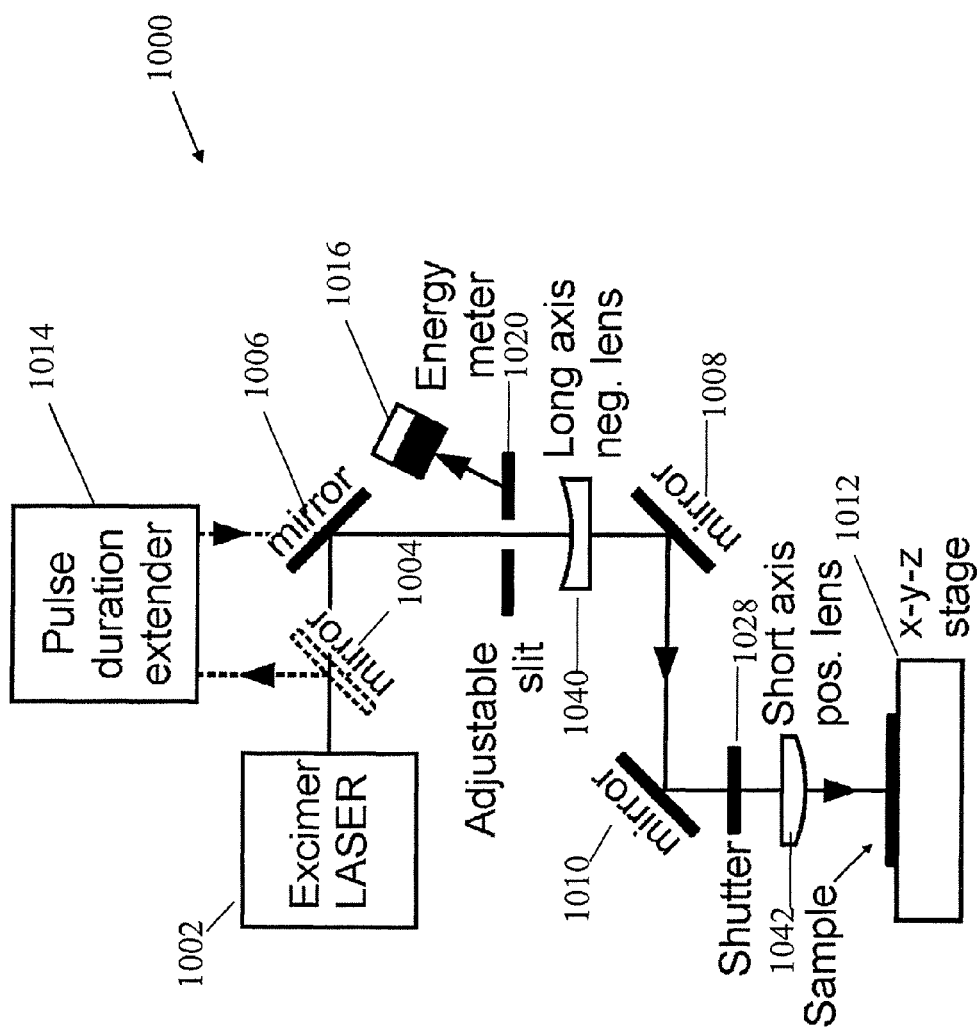
FIG. 10 is a schematic diagram of an apparatus for sequential lateral solidification of a thin film according to some embodiments.

FIG. 10 schematically depicts a line scan crystallization system 1000 using high aspect ratio pulses. The system includes a laser pulse source 1002, operating for example at 308 nm (XeCl) or 248 nm or 351 nm. A series of mirrors 1006, 1008, 1010 direct the laser beam to a sample stage 1012, which is capable of sub-micron precision in the x- and z- (and optionally y-) directions. The system also includes slit 1020 that can be used to control the spatial profile of the laser beam and energy density meter 1016 to read the reflection of the light off of slit 1020. Shutter 1028 can be used to block the beam when no sample is present or no irradiation is desired. Sample 1030 can be positioned on stage 1012 for processing.

Laser-induced crystallization is typically accomplished by laser irradiation using a wavelength of energy that can be at least partially absorbed by the film, with an energy density, or fluence, high enough to melt the film. Although the film can be made of any material susceptible to melt and recrystallization, silicon is useful for display applications. In some embodiments, the laser pulses generated by the source 1002 have an energy in the range of 50-200 mJ/pulse and a pulse repetition rate around 4000 Hz or more. Excimer lasers currently available from Cymer, Inc. San Diego, Calif., can achieve this output. Although an excimer laser system is described, it is appreciated that other sources capable of providing laser pulses at least partially absorbable by a desired film can be used. For example, the laser source can be any conventional laser source, including but not limited to, excimer laser, continuous wave laser and solid-state laser. The irradiation beam pulse can be generated by another known source or short energy pulses suitable for melting a semiconductor can be used. Such known sources can be a pulsed solid state laser, a chopped continuous wave laser, a pulsed electron beam and a pulsed ion beam, etc.

The system optionally includes a pulse duration extender 1014 that is used to control the temporal profile of the laser pulses. Optional mirror 1004 can be used to direct the laser beam into extender 1014, in which case mirror 1006 would be removed. Since crystal growth can be a function of the duration of the laser pulse used to irradiate the film, pulse duration extender 1014 can be used to lengthen the duration of each laser pulse to achieve a desired pulse duration. Methods of extending pulse durations are known.

Slit 1020 can be used to control the spatial profile of the laser beam. Specifically, it is used to give the beam a high aspect ratio profile. The laser beam from source 1002 can have a Gaussian profile, for example. Slit 1020 significantly narrows one spatial dimension of the beam. For example, before slit 1020, the beam can be between 10 and 15 mm wide and 10 to 30 mm long. The slit could be substantially thinner than the width, for example about 300 microns wide, which results in a laser pulse that has a short axis of about 300 microns, and a long axis that can be unmodified by the slit. Slit 1020 is a simple method of producing a narrow beam from a relatively wide beam, and also has the benefit of providing a 'top hat' spatial profile, which has a relatively uniform energy density across the short axis. In another embodiment, instead of using slit 1020, a very short focal length lens can be used to tightly focus one dimension of a laser beam onto the silicon film. It is also possible to focus the beam onto the slit 1020; or, more generally, using optical elements (e.g., a simple cylindrical lens) to narrow the short axis of the beam from source 1002 so that less energy is lost upon passing slit 1020 yet some sharpening is achieved.

The laser beam is then modified using two fused silica cylindrical lenses 1020, 1022. The first lens 1020, which is a negative focal length lens, expands the size of the long axis of the beam, the profile of which can be relatively uniform, or can have gradual changes that are not apparent over the length of the long axis. The second lens 1022 is a positive focal length lens that reduces the size of the short axis. The projection optics reduce the size of the laser beam in at least the short dimension, which increases the fluence of the laser pulse when it irradiates the film. The projection optics can be a multiple-optic system that reduces the size of the laser beam in at least the short dimension by a factor of 10-30×, for example. The projection optics can also be used to correct for spatial aberrations in the laser pulses, for example, spherical aberrations. In general, the combination of slit 1020, lenses 1020, 1022, and the projection optics is used to ensure that each laser pulse irradiates the film with an energy density that is high enough to melt the film, with a homogeneity and length along the long axis that is sufficiently long to minimize or eliminate variations of the crystallization of the film. Thus, for example, a 300 micron wide beam is reduced to, for example, a 10 micron width. Narrower widths are also contemplated. Homogenizers can also be used on the short axis.

In some embodiments, the line scan crystallization system 1000 can include a variable attenuator and/or a homogenizer, which can be used to improve the spatial homogeneity along the long axis of the laser beam. The variable attenuator can have a dynamic range capable of adjusting the energy density of the generated laser beam pulses. The homogenizer can consist of one or two pairs of lens arrays (two lens arrays for each beam axis) that are capable of generating a laser beam pulses that have uniform energy density profiles.

In general, the film itself is not required to move during crystallization; the laser beam or a mask defining the laser beam shape could be scanned across the film instead to provide a relative motion of the irradiated region and the film. However, moving the film relative to the laser beam can provide improved uniformity of the laser beam during each subsequent irradiation event.

The line scan crystallization system can be configured to create a long and narrow laser beam that measures, for example, about 4-15 µm on the short axis and can be 50-100 microns on the long axis in some embodiments, and tens of centimeters or up to more than one meter on the long axis in other embodiments. In general the aspect ratio of the beam is high enough that the irradiated region can be considered a "line." The length to width aspect ratio can be in the range of about 50 up to about $1 \times 10^5$ or more, for example. In one or more embodiments, the width of the short axis does not exceed the width of twice the characteristic lateral growth length of the laterally solidified crystals, so that no nucleated polysilicon is formed between the two laterally grown areas. This is useful for the growth of "uniform" crystals and also for the general improvement of crystal quality. The desired length of the long axis of the laser beam can be dictated by the size of the substrate, and the long axis can extend substantially along the entire length of the substrate, or of the display to be fabricated (or a multitude thereof), or of a single TFT device in the display, or a TFT circuit on the periphery of the display (e.g., containing drivers) or in other words the integration area. The beam length can in fact also be dictated by the dimension of the integration areas of two adjacent displays combined. The energy density, or fluence, along the length of the beam can be made substantially uniform, for example, such that it varies by no more than 5% along its entire length. In other embodiments, the energy density along the length of the beam covering the length of interest is of a sufficiently low value that no agglomeration occurs in either one or as a result of a series of overlapping pulses. Agglomeration is a result of localized high energy density that can lead to film disruption.

Figure 12:
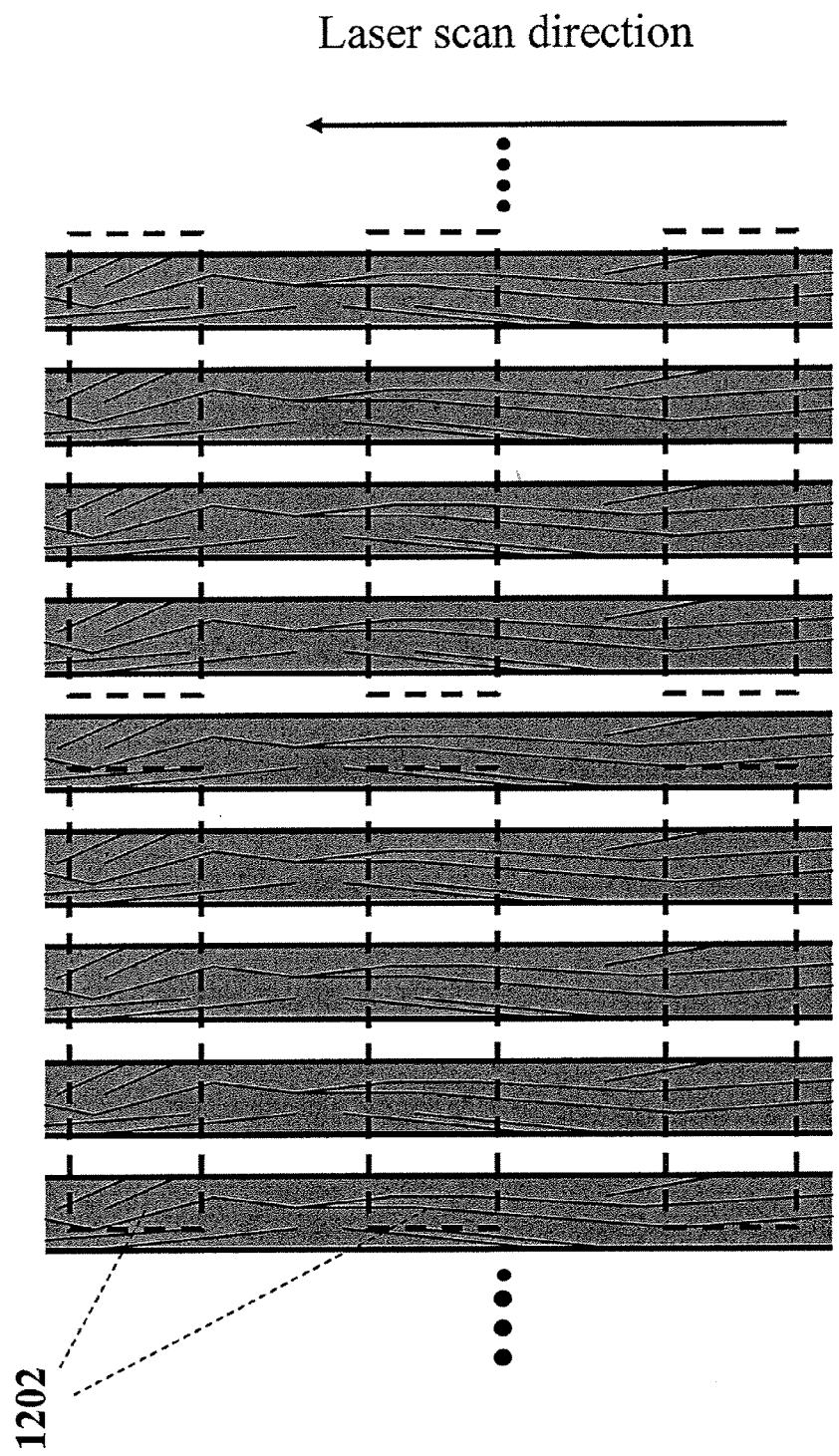
FIG. 12 is a schematic illustration of a system with multiple TFTs utilizing crystallized stripes according to another embodiment.

Some other embodiments, use a directional crystallization method, for example directional SLS, such that while some crystallized regions of neighboring TFTs can be correlated, due to averaging, TFTs have uncorrelated properties. FIG. 12 depicts one such embodiment. In these embodiments, each TFT channel 1202 (shown in broken line rectangles) covers multiple stripes, and thus grains and grain boundaries, such that their properties average over the areas of the channel. For TFT's that neighbor each other along the direction of the laser scan, grains that are located in the same stripe could be correlated. But since each TFT covers multiple uncorrelated stripes, the overall property of each TFT is averaged over multiple stripes and is not correlated with the neighboring TFT.

Further details of line-scan SLS can be found in U.S. patent application Ser. No. 11/293,655, filed Dec. 2, 2005 and entitled "Line Scan Sequential Lateral Solidification of Thin Films," the entire contents of which are incorporated herein by reference.

While there have been shown and described examples of the present invention, it will be readily apparent to those skilled in the art that various changes and modifications can be made therein without departing from the scope of the invention. Those skilled in the art will recognize, or be able to ascertain, using no more than routine experimentation, numerous equivalents to the specific compositions and procedures described herein. Such equivalents are considered to be within the scope of this invention, and are covered by the following claims.

The invention claimed is:

1. A display device, comprising:
a plurality of thin film transistors (TFTs) on a substrate, said TFTs spaced apart from each other and each including a channel region that has a crystalline microstructure and a direction along which a channel current flows;
wherein the channel region of each of the plurality of TFTs includes a plurality of crystalline stripes, each spanning the length of the channel region along its channel direction, and wherein each crystalline stripe of the plurality of stripes is physically disconnected from and crystallographically uncorrelated with other stripes of the plurality of stripes in that channel region or in the channel regions of adjacent TFTs;
wherein at least one crystalline stripe contains a crystallographic grain that spans the length of the channel region along its channel direction, and wherein the at least one crystallographic grain is physically disconnected from and crystallographically uncorrelated with at least another crystallographic grain in that channel region or the plurality of stripes in the channel regions of adjacent TFTs.

2. The display device of claim 1, wherein one or more of the plurality of crystalline stripes are nano-wires.

3. The display device of claim 1, wherein one or more of the plurality of stripes is a non-straight stripe, wherein each of the non-straight stripes connects a first base line portion to a second base line portion, while not covering the whole area of the quadrilateral formed by the first and the second base line portions and a first and a second side line portions, wherein the first side line portion connects a first end of the first base line portion with a first end of the second base line portion, and wherein the second side line portion connects a second end of the first base line portion with a second end of the second base line portion.

4. The display device of claim 1, wherein outside the plurality of the TFTs, the substrate is covered by a material different from the material used by the TFTs.

5. The display device of claim 1, further comprising a capping layer on top of the plurality of TFTs.

6. The display device of claim 1, wherein the channel region of each of the plurality of TFTs contains crystallized silicon.

7. The display device of claim 1, wherein the channel region of each of the plurality of TFTs includes a source region at one end and a drain region at the other end, and wherein each channel region of the plurality of channel regions includes a plurality of crystalline stripes, and
wherein for each channel region, each stripe spans the length of that channel region between the source region and the drain region, and inside the source region and the drain region, each crystalline stripe is physically connected to an adjacent crystalline stripe, and
wherein each of the plurality of crystalline stripes of each channel region is physically disconnected from and crystallographically uncorrelated with each of the plurality of crystalline stripes in the channel regions of adjacent TFTs.

8. An article, used in manufacturing display devices, comprising:
a substrate; and
a plurality of crystalline islands located on substrate and spaced apart from each other;
wherein each crystalline island includes a plurality of crystalline stripes, each spanning the whole length of one dimension of that crystalline island, and wherein each crystalline stripe of the plurality of stripes is physically disconnected from and crystallographically uncorrelated with other stripes in the plurality of stripes in that crystalline island or in the adjacent crystalline islands;
wherein at least one crystalline stripe contains a crystallographic grain that spans the length of that crystalline island, and wherein the at least one crystallographic grain is physically disconnected from and crystallographically uncorrelated with at least another crystallographic grain in that crystalline island or the plurality of crystalline stripes of other crystalline islands.

9. The article of claim 8, wherein one or more of the plurality of crystalline stripes are nano-wires.

10. The article of claim 8, wherein one or more of the plurality of stripes is a non-straight stripe, wherein each of the non-straight stripes connects a first base line portion to a second base line portion, while not covering the whole area of the quadrilateral formed by the first and the second base line portions and a first and a second side line portions, wherein the first side line portion connects a first end of the first base line portion with a first end of the second base line portion, and wherein the second side line portion connects a second end of the first base line portion with a second end of the second base line portion.

11. The article of claim 8, wherein outside the plurality of crystalline islands, the substrate is covered by a material different from the material used by crystalline islands.

12. A method of manufacturing display devices comprised of a plurality of thin films transistors (TFTs) on a substrate, the method comprising the steps of:
  adding an amorphous or multicrystalline silicon layer over the substrate;
  patterning the silicon layer into a plurality of islands that are physically disconnected;
  crystallizing the plurality of islands by applying line scan sequential lateral solidification; and
  fabricating the plurality of TFTs, wherein each TFT uses one or more of the plurality of islands and wherein none of the plurality of islands is used by two of the plurality of TFTs and wherein each TFT includes a channel region;
  wherein each island includes a plurality of stripes, each stripe spanning one dimension of the corresponding island, wherein each stripe of the plurality of islands is physically disconnected from other stripes of the plurality of stripes in the corresponding island or in other islands;
  wherein at least one stripe contains a crystallographic grain that spans the length of the corresponding island, and wherein the at least one crystallographic grain is physically disconnected from and crystallographically uncorrelated with at least another crystallographic grain in that island or crystallographic grains of other islands.

13. The method of claim 12, wherein patterning the silicon layer is comprised of depositing a photoresist on the substrate, exposing the photoresist to a light patterned in accordance with the shapes and locations of the plurality of silicon islands, developing the photoresist, and etching away the content of the silicon layer outside the location of the plurality of silicon islands.

14. The method of claim 12, wherein one or more of the plurality of stripes are nano-wires.

15. The method of claim 14, wherein line scan sequential lateral solidification uses a laser beam that is shaped as a rectangle and wherein the angle between the long axis of the rectangle and the long axis of the plurality of stripes is more than zero degrees.

16. The method of claim 12, further comprising covering the plurality of islands with a capping layer before applying line scan sequential lateral solidification.

17. The method of claim 16, wherein the capping layer includes silica.

* * * * *

UNITED STATES PATENT AND TRADEMARK OFFICE
CERTIFICATE OF CORRECTION

PATENT NO.       : 8,614,471 B2                                                      Page 1 of 1
APPLICATION NO. : 12/679064
DATED            : December 24, 2013
INVENTOR(S)      : Im et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 722 days.

Signed and Sealed this
Twenty-second Day of September, 2015

Michelle K. Lee
*Director of the United States Patent and Trademark Office*